(12) United States Patent
ElMasry et al.

(10) Patent No.: US 6,955,858 B2
(45) Date of Patent: Oct. 18, 2005

(54) TRANSITION METAL DOPED FERROMAGNETIC III-V NITRIDE MATERIAL FILMS AND METHODS OF FABRICATING THE SAME

(75) Inventors: Nadia A. ElMasry, Raleigh, NC (US); Salah M. Bedair, Raleigh, NC (US); Meredith L. Reed, Garner, NC (US); Hans Stadelmaier, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 242 days.

(21) Appl. No.: 10/313,975

(22) Filed: Dec. 6, 2002

(65) Prior Publication Data

US 2003/0136986 A1   Jul. 24, 2003

Related U.S. Application Data

(60) Provisional application No. 60/338,226, filed on Dec. 7, 2001.

(51) Int. Cl.[7] .......................... B32B 9/00; C30B 29/38; C30B 29/40
(52) U.S. Cl. ...................... 428/698; 428/697; 428/704; 423/361; 423/374; 117/952; 117/953; 117/954
(58) Field of Search ............................... 428/698, 689, 428/697, 704; 423/361, 374; 117/952, 953, 117/954

(56) References Cited

U.S. PATENT DOCUMENTS

| | | | |
|---|---|---|---|
| 4,421,576 A | * | 12/1983 | Jolly ............................ 117/95 |
| 4,609,411 A | * | 9/1986 | Kohashi et al. ............... 117/57 |
| 5,294,287 A | | 3/1994 | Chang et al. |
| 5,909,036 A | | 6/1999 | Tanaka et al. |
| 6,007,622 A | * | 12/1999 | Kawase et al. ............... 117/82 |
| 6,255,669 B1 | * | 7/2001 | Birkhahn et al. ............. 257/89 |
| 6,876,013 B2 | * | 4/2005 | Okano et al. ................ 257/198 |

OTHER PUBLICATIONS

Bouchaud, Jean-Pierre, "Propriétés Magneétiques et Structurales des Carbonitrures de Manganése et des Perowskites $Mn_3GaC$ et $Mn_3GaN$," *Annales de Chimie*, 3 81-105 (1968). (abstract) (only Abstract in English).

Dietl et al., "Zener Model Description of Ferromagnetism in Zinc-Blende Magnetic Semiconductors," *Science*, 287 1019-1022 (Feb. 11, 2000).

Edington, J.W., "Electron Diffraction in the Electron Microscope," *Monographs in Practical Electron Microscopy in Materials Science*, 2 51-54 (1975).

Fiederling et al., "Injection and Detection of a Spin-Polarized Current in a Light-Emitting Diode," *Nature*, 402 787-790 (Dec. 16, 1999).

Hajjar et al., "Magnetoresistance Peaks in the Neighborhood of Coercivity in Magneto-optical Recording Media," *Journal of Applied Physics*, 72:4 1528-1538 (Aug. 15, 1992).

Kuwabara et al., "Preparation of Wurtzite GaN-Based Magnetic Alloy Semiconductors by Molecular Beam Epitaxy," *Physica E*, 10 233-236 (2001).

(Continued)

*Primary Examiner*—Stephen Stein
(74) *Attorney, Agent, or Firm*—Myers Bigel Sibley & Sajovec

(57) ABSTRACT

Transition metal doped II–V nitride material films exhibit ferromagnetic properties at or above room temperature. A III–V nitride material film may be doped with a transition metal film in-situ during metal-organic chemical vapor deposition and/or by solid-state diffusion processes. Doping of the III–V nitride material films may proceed in the absence of hydrogen and/or in the presence of nitrogen. In some embodiments, transition metal-doped III–V nitride material films comprise carbon concentrations of at least $10^{17}$ atoms per cubic centimeter.

35 Claims, 15 Drawing Sheets

OTHER PUBLICATIONS

Munekata et al., "Diluted Magnetic III-V Semiconductors," *Phys. Rev. Let.*, 63:17 1849-1852 (1989).

Ohno et al., "(Ga,Mn)As: A New Diluted Magnetic Semiconductor Based on GaAs," *Applied Physics Letters*, 69:3 363-365 (Jul. 15, 1996).

Ohno et al., "Electrical Spin Injection in a Ferromagnetic Semiconductor Heterostructure," *Nature*, 402 790-792 (Dec. 16, 1999).

Ohno, Hideo, "Properties of Ferromagnetic III-V Semiconductors," *Journal of Magnetism and Magnetic Materials*, 200 110-129 (1999).

Reed et al., "Room Temperature Ferromagnetic Properties of (Ga, Mn)N," *Applied Physics Letters*, 79:21 3473-3475 (Nov. 19, 2001).

Reed et al., "Room Temperature Magnetic (Ga,Mn)N: A New Material for Spin Electronic Devices," *Materials Letters*, 51 500-503 (2001).

* cited by examiner

TRANSITION METAL DOPED FERROMAGNETIC III-V NITRIDE MATERIAL FILMS AND METHODS OF FABRICATING THE SAME

CROSS REFERENCE TO RELATED APPLICATIONS

This application claims the benefit of Provisional Application Ser. No. 60/338,226, filed Dec. 7, 2001, the disclosure of which is incorporated by reference herein its entirety.

FEDERALLY SPONSORED RESEARCH

The U.S. Government may have certain rights to this invention as provided for by the terms of Contract Number DAAD19-01-1-0715, awarded by the Army Research Office, and by the terms of Contract Number N00014-01-1-0792, awarded by the DARPA Spins Program.

FIELD OF THE INVENTION

This invention relates to semiconductor devices, dilute magnetic semiconductors, and fabrication methods, and more particularly to III–V material films and fabrication methods therefor.

BACKGROUND OF THE INVENTION

Interest in spin polarization and spin injection into electronic devices has resulted in the development of dilute magnetic semiconductor (DMS) materials. The discovery of carrier-induced ferromagnetism in DMS materials has resulted in further studies of DMS materials. Of particular interest is the potential for exploiting the ferromagnetic properties of DMS materials for use in data storage, data processing, semiconductor, and/or optoelectronic systems.

Previous efforts to develop spin polarization and spin injection of carriers in electronic devices were focused on the direct electrical injection of polarized electrons using a ferromagnetic metal/semiconductor junction. However, this approach can suffer from the scattering of the spin polarized carriers at the metal/semiconductor interface. A different approach involved the growth of magnetic semiconductor films to form DMS materials. In particular, research on DMS materials has focused on binary alloys of II–VI and III–V materials, such as BeSe, GaAs, and GaN materials.

In 1989, carrier induced ferromagnetism was discovered in (In,Mn)As. (See, H. Munekata, H. Ohno, S. von Molnar, A. Segmuller, L. L. Chang, and L. Esaki, Physical Review Letters, 63, 1849 (1989)). In 1996, carrier induced ferromagnetism was discovered in (Ga,Mn)As. (See, H. Ohno, A. Shen, F. Matsukura, A. Oiwa, A. Endo, S. Katsumoto, and Y. Iye, Applied Physics Letters, 69, 363 (1996)). The ferromagnetic properties of the disclosed materials, however, were limited to temperatures below 110 K.

Since the discovery of ferromagnetic properties in III–V material systems at low temperatures, many attempts to develop materials exhibiting ferromagnetic properties at room temperature have been made. In particular, III–V material systems involving GaAs have been developed. DMS materials exhibiting Curie temperatures on the order of 110 K have been reported for (Ga,Mn)As materials. Such films were grown using molecular beam epitaxy at low temperatures to produce the Mn-doped GaAs. (See, H. Ohno, J. Magn. Magn. Mater. 200, 110 (1999); see also, Y. Ohno, D. K. Young, B. Beschoten, F. Matsukura, H. Ohno, and D. D. Awschalom, Nature 402 (1999) 790).

Another approach involves creating spin polarization in the II–VI materials of the semiconductor $Be_xMn_yZn_{1-x-y}Se$. (See, R. Fiederling, M. Keim, G. Reuscher, W. Ossau, G. Schmidt, A. Wang and L. W. Molenkamp, Nature 402 (1999) 787). However, the proposed $Be_xMn_yZn_{1-x-y}Se$ material exhibits low magnetic ordering temperatures, which can limit potential use of the material to applications below room temperature.

Numerous attempts to develop room temperature ferromagnetic properties in GaN heterostructures have been proposed. A theoretical model predicting ferromagnetic behavior of various Mn-doped semiconductors predicted that the DMS material (Ga,Mn)N would exhibit a Curie temperature above room temperature for p-type semiconductors wherein the doping includes at least 5 percent manganese. (T. Dietl, H. Ohno, F. Matsukura, J. Cibert, and D. Ferrand, Science 287, 1019 (2000)).

Several attempts have been made to develop GaN-based DMS materials exhibiting ferromagnetic properties above room temperature. Growth of (Ga,Mn)N by Molecular Beam Epitaxy has formed films with Curie temperatures on the order of 20 K. (See, S. Kuwabara, K. Ishii, S. Haned, T. Kondo, and H. Munekata, Physica E 10, 233–236 (2001)). Growth of (Ga,Mn)N films by metal-organic chemical vapor deposition (MOCVD) have produced information on the optical properties of (Ga,Mn)N films.

Previous formation of semiconductor magnetic materials of the II–VI and III–V type materials tend to have low magnetic ordering temperatures, which may limit such material systems to potential applications carried out below room temperature. Further, proposed theoretical models of ferromagnetic III–V material systems do not appear to have resulted in ferromagnetic III–V material systems exhibiting ferromagnetic properties at or above room temperature. Therefore, it is desirable to form a semiconductor magnetic material of the III–V type materials exhibiting ferromagnetic properties at or above room temperature.

SUMMARY OF THE INVENTION

Embodiments of the present invention provide transition metal doped III–V material films that exhibit ferromagnetic properties at or above room temperature. Embodiments of the present invention also provide methods of epitaxially growing III–V material films and doping the III–V material films with transition metals.

In some embodiments of the invention, a thin film of a transition metal doped III–V material is ferromagnetic at or above room temperature. The III–V material may include binary, ternary, and/or quaternary III–V material. In some embodiments, the III–V material is a III–V nitride material such as gallium nitride, aluminum nitride, aluminum gallium nitride, indium nitride, indium gallium nitride, indium aluminum gallium nitride, their heterostructures, and/or mixtures thereof. Gallium arsenide materials may also be formed as a III–V material. The transition metals used to dope the III–V material may include one or more transition metals selected from groups 1B and 3B through 8B of the periodic table. In some embodiments, the transition metal is manganese, chromium, iron, and/or mixtures thereof.

In other embodiments, a transition metal doped III–V material film includes a carrier concentration of at least $10^{17}$ atoms per cubic centimeter. In some embodiments, the carrier comprises carbon. In those embodiments where the carrier comprises carbon, the concentration of carbon in the transition metal doped III–V material may be maintained at or above $10^{17}$ atoms per cubic centimeter by doping the III–V material in the absence of, or in a reduced amount of, hydrogen. The carbon concentration may also be maintained by using low temperature doping methods rather than the conventional high temperature methods.

In other embodiments of the invention, methods for forming III–V material films comprise epitaxially growing a III–V material film on a substrate in the presence of nitrogen carrier gas. Doping of the III–V material film may also be carried out in the presence of nitrogen carrier gas.

BRIEF DESCRIPTION OF THE DRAWING FIGURES

The invention can be more readily ascertained from the following description of the invention when read in conjunction with the accompanying drawings in which.

DETAILED DESCRIPTION OF THE INVENTION

Figure 1:
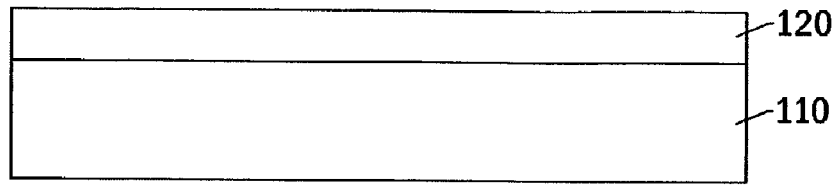
FIG. 1 illustrates a structure including a transition metal doped III–V material film according to embodiments of the invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or "onto" another element, it can be directly on the other element or intervening elements may also be present. When an element such as a layer, region or substrate is referred to as being "directly on" another element, it is in direct contact with that other element.

The present invention relates to ferromagnetic III–V materials. Embodiments of the present invention provide transition metal doped III–V material films or crystal structures exhibiting ferromagnetic properties at or above room temperature and methods of fabricating the same.

Embodiments of the present invention provide transition metal doped III–V material films that exhibit ferromagnetic behavior at or above room temperature and methods of fabricating such structures. According to various embodiments, III–V material films may be doped with one or more transition metals to form transition metal doped III–V material films that exhibit ferromagnetic properties at or above room temperature. The exhibition of ferromagnetic properties at or above room temperature in the transition metal doped III–V material films may be achieved by controlling the formation of the transition metal doped III–V material film using solid-state diffusion processes and/or metal-organic chemical vapor deposition processes (MOCVD).

The III–V material films of the various embodiments of the invention include material films having one or more elements in the material film structure from both groups 3A and 5A of the periodic table of elements. The III–V material films may include binary, ternary, and/or quaternary III–V material films. In some embodiments, the III–V material films are nitride films that include one or more elements from group 3A of the periodic table of elements and nitrogen in the material film structure. For example, the III–V material films may include, but are not limited to, gallium nitride (GaN), aluminum nitride (AlN), indium nitride (InN), aluminum gallium nitride (AlGaN), indium gallium nitride (InGaN), indium aluminum gallium nitride (InAlGaN), their heterostructures, and/or mixtures thereof.

The III–V material films of various embodiments of the invention may be doped with a transition metal or mixtures of transition metals to form the transition metal doped III–V material films of the invention. Transition metals that may be used for doping the III–V material films according to the embodiments of the invention include the metals in groups 1B and 3B through 8B of the periodic table of elements. In some embodiments, the transition metals used as doping agents include chromium, manganese, iron, and/or mixtures thereof.

Figure 2:
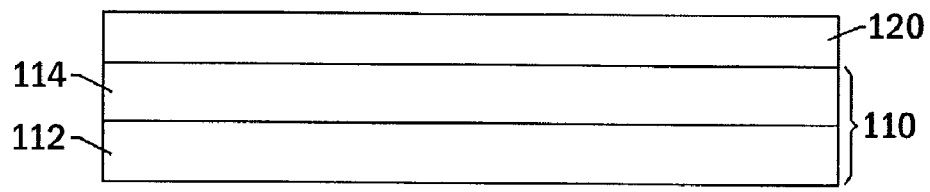
FIG. 2 illustrates a structure including a transition metal doped III–V material film according to other embodiments of the invention.

Typically, the transition metal doped III–V material films of the invention are formed on a substrate. The substrate may include a single or compound semiconductor substrate, a conductive substrate and/or an insulating substrate. One or more buffer layers or other intermediate layers may be included between the substrate and the transition metal doped III–V material film. The formation of an exemplary transition metal doped III–V material film on a substrate in accordance with various embodiments of the present invention is illustrated in FIGS. 1–8. As illustrated in FIG. 1, a transition metal doped III–V material film 120 is formed on a substrate 110. The transition metal doped III–V material film 120 may be formed on substrate 110 using solid-state diffusion, MOCVD, and/or other known processes. As known, substrate 110 may include multiple layers such as an underlying layer 112 and a buffer layer 114 as illustrated in FIG. 2. The buffer layer 114 may include a layer of non-doped III–V material used to form a transition metal doped III–V material film 120 of the present invention.

In some embodiments of the invention, the transition metal doped III–V material film 120 may be formed by the doping of a III–V material film using a solid-state diffusion process. Exemplary steps in a solid-state diffusion process according to various embodiments of the present invention are illustrated in the flow diagram of FIG. 3. Initially, a substrate is provided at Block 302. A III–V material film is formed on the substrate at Block 304. A transition metal film is formed on the III–V material film at Block 306. Atoms from the transition metal film are then diffused into the III–V material film by annealing at Block 308 to form the transition metal doped III–V material film 120 illustrated in FIG. 1. For instance, a gallium nitride film may be formed on a substrate by MOCVD at Block 304. A manganese layer may be formed on the gallium nitride film using a laser ablation deposition at Block 306. The structure may be annealed to dope the gallium nitride material film with the manganese at Block 308. Doping densities in a III–V material film formed by solid-state diffusion tend to decrease with increasing depth of the doped III–V material film. In some instances, the doping densities are Gaussian in nature. In other words, the density of the dopant in the III–V material film is greater near the surface of the III–V material film, with decreasing density as the depth into the III–V material film increases.

Figure 3:
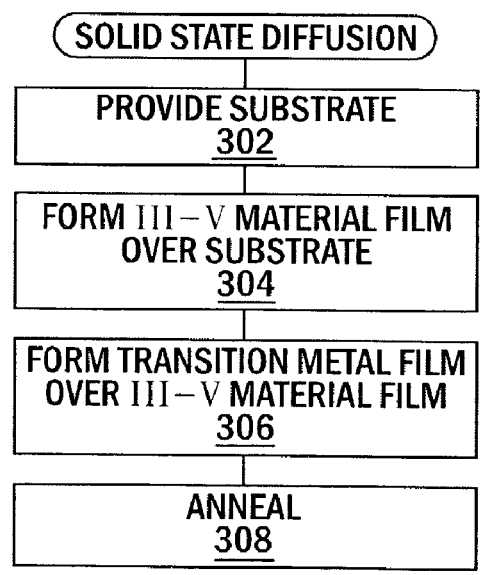
FIG. 3 illustrates a flow diagram of methods of fabricating III–V materials according to embodiments of the invention.
Figure 4:
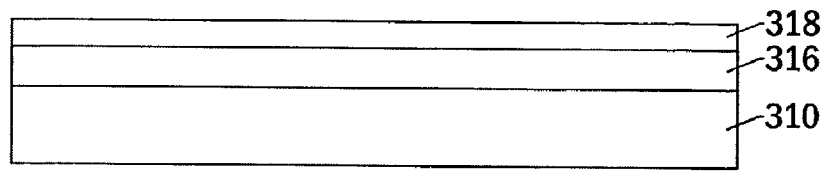
FIG. 4 illustrates a structure that may be formed in accordance with the methods illustrated in FIG. 3.

FIG. 4 illustrates an exemplary structure of the substrate 310, III–V material film 316, and transition metal film 318 formed using the process illustrated in FIG. 3. After annealing (Block 308) any transition metal film 318 that remains (if any) may be removed using conventional techniques.

Figure 5:
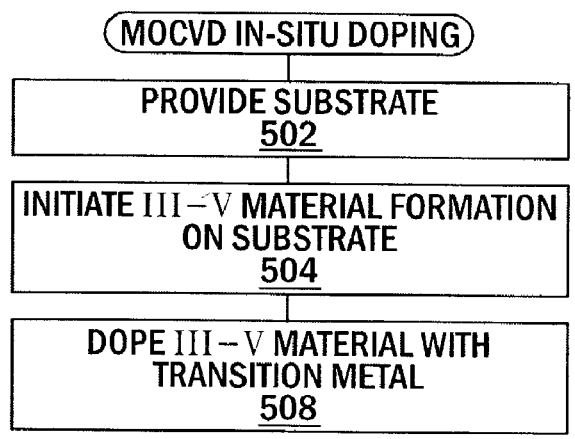
FIG. 5 illustrates a flow diagram of methods of fabricating III–V materials according to embodiments of the invention.

In other embodiments of the invention, the transition metal doped III–V material film 120 may be in-situ doped during an MOCVD process. An exemplary flow diagram illustrating the steps of a MOCVD process according to embodiments of the invention is illustrated in FIG. 5. A substrate is provided at Block 502. Formation of a III–V material film is initiated on the substrate using MOCVD at Block 504. Atoms of a transition metal are doped into the III–V material film being formed during the MOCVD process at Block 508. The doping of the III–V material film in the MOCVD process may occur in-situ as the III–V material film is being deposited on the substrate. Such in-situ doping tends to produce a doping density profile that is substantially consistent throughout the transition metal doped III–V material film.

Figure 6:
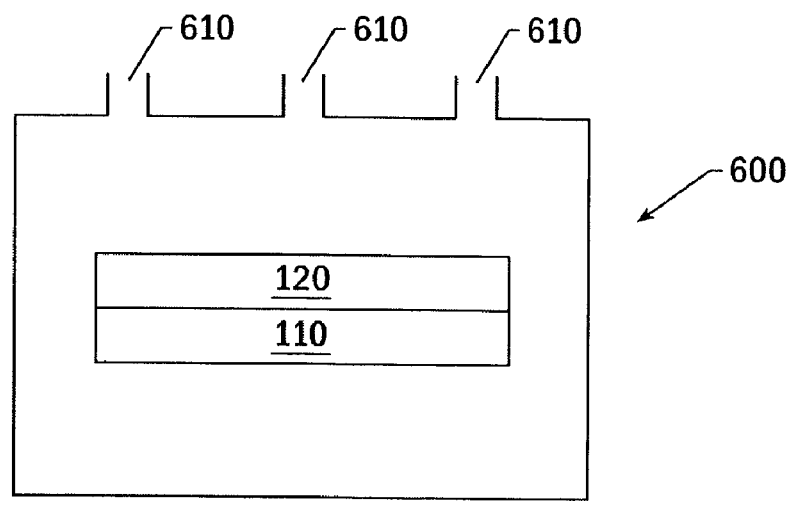
FIG. 6 illustrates a chemical vapor deposition chamber for use with various embodiments of the invention.

An example of a chemical vapor deposition (CVD) chamber 600 that may be used with the embodiments of the present invention to form III–V material layers, and transition metal doped III–V material films, is illustrated in FIG. 6. The CVD chamber 600 is preferably a MOCVD chamber including one or more gas inlets 610. The gas inlets 610 may be used to feed carrier gases, reaction gases, or other gases to the CVD chamber 600. A III–V material film (not shown) or a transition metal doped III–V material film 120 may be deposited on a substrate 110 within the CVD chamber 600. The CVD chamber 600 may include other components common to CVD chambers 600, such as vacuum devices, temperature control devices, gas flow devices, gas storage units, and the like.

Figure 7:
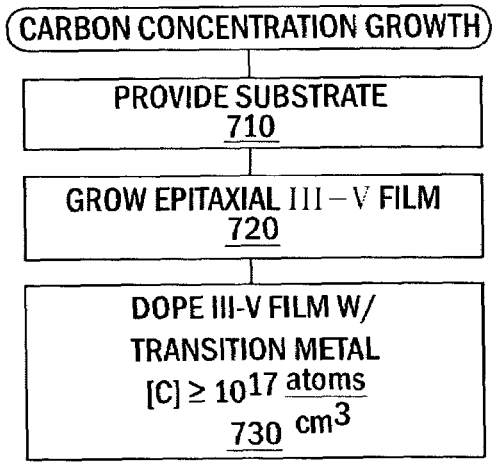
FIG. 7 illustrates a flow diagram of methods of fabricating III–V materials according to still other embodiments of the invention.

In other embodiments of the invention, a flow diagram for which is illustrated in FIG. 7, a substrate is provided at Block 710. An epitaxial layer of an un-doped III–V material film is formed on the substrate at Block 720. The III–V material film is then doped with a transition metal at Block 730. A background carrier or carbon concentration greater than $10^{17}$ atoms per cubic centimeter exists in the transition metal doped III–V material film. It is understood that the doping of the III–V material film at Block 730 may include doping resulting from solid-state diffusion and/or in-situ doping as in an MOCVD doping process. As will be discussed below, in some embodiments, this carbon concentration may be altered by using a nitrogen carrier gas rather than a hydrogen carrier gas as is conventionally used.

Figure 8:
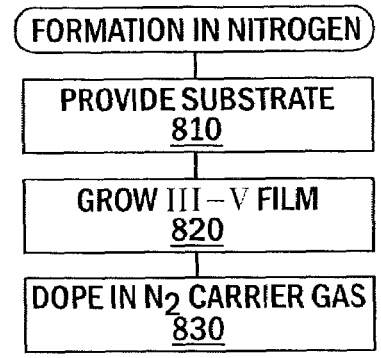
FIG. 8 illustrates a flow diagram of methods of fabricating III–V materials according to embodiments of the invention.

In other embodiments of the invention, a flow diagram for which is illustrated in FIG. 8, a substrate is provided at Block 810. A III–V material film is formed on the substrate at Block 820. The III–V material film is doped with at least one transition metal in the presence of a nitrogen carrier gas at Block 830. The doping at Block 830 may be achieved by solid-state diffusion in a nitrogen carrier gas or by in-situ doping within a MOCVD process using a nitrogen carrier gas.

In accordance with some embodiments of the present invention, transition metal doped III–V material films exhibiting ferromagnetic properties at or near room temperatures have been formed. For instance, manganese-doped gallium nitride films ((Ga,Mn)N) exhibiting ferromagnetic properties at room temperature have been formed. The Mn-doped GaN films according to embodiments of the present invention may be formed using MOCVD with in-situ doping methods and/or MOCVD with solid-state diffusion processes.

The ferromagnetic properties of the Mn-doped GaN films formed according to the embodiments of the invention may depend on the growth conditions of GaN such as the growth temperature, the gallium to nitrogen ratio in the III–V material film, flux rates of deposition gases, the growth rate of the films, and the annealing conditions for the transition metal.

For example, Mn-doped GaN films were grown by MOCVD on c-plane sapphire substrates in a radio frequency inductively heated vertical chamber according to embodiments of the invention. Trimethylgallium (TMGa), bisethylcyclopentadienyl manganese $(EtCp)_2Mn$, and $NH_3$ were used as precursors for the deposition of GaN. A low temperature (500° C.) GaN buffer layer of about 40 nm thick was first grown on the sapphire substrate. An un-doped GaN epitaxial layer about 0.1 μm thick was grown over the GaN buffer layer at about 1040° C. to serve as a template for the Mn-doped GaN film. The growth temperatures and pressures used for the formation of the Mn-doped GaN film were varied from about 700° C. to about 1040° C., and from about 100 Torr to about 760 Torr, respectively. The thickness of the (Ga,Mn)N films formed varied between about 0.6 μm to about 1.4 μm. The Mn-doped GaN films formed by the MOCVD process were studied by X-ray diffraction (XRD), Secondary Ion Mass Spectrometry (SIMS) and Vibrating Sample Magnetometer (VSM) to determine the crystal quality and the nature of any secondary phases, the chemical composition, and magnetic behavior of the films. Hall measurements were also performed to determine the electrical properties of the Mn-doped GaN films formed by MOCVD. Room temperature ferromagnetic behavior was observed in single crystal, or solid solution, (Ga,Mn)N films grown by MOCVD according to embodiments of the invention.

Figure 9:
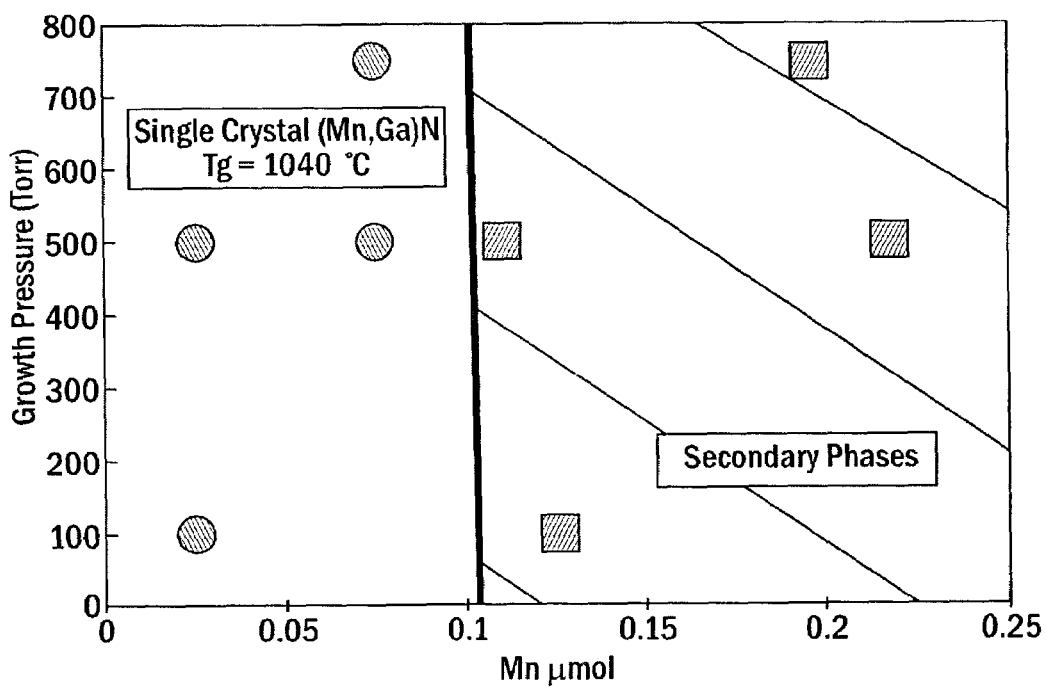
FIG. 9 illustrates a phase diagram for a Mn-doped GaN film.
Figure 10:
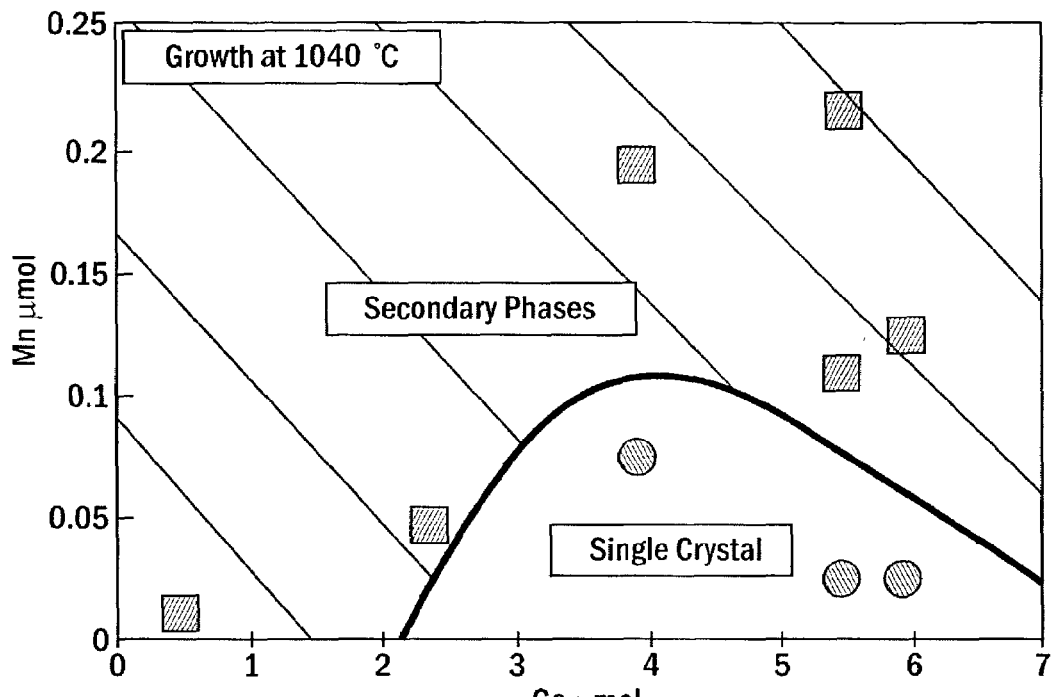
FIG. 10 illustrates a phase diagram for a Mn-doped GaN film.
Figure 11:
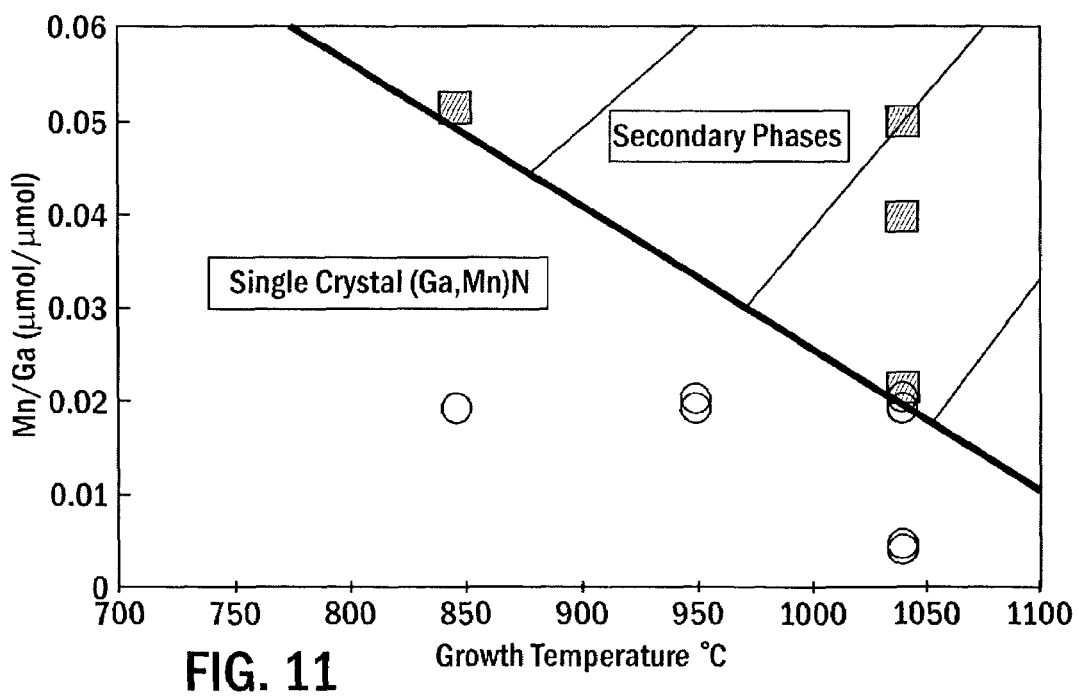
FIG. 11 illustrates a phase diagram for a Mn-doped GaN film.

Based upon XRD data of the MOCVD created films, the range of solid solubility of Mn in GaN as a function of $(EtCp)_2Mn$ flux, TMGa flux, growth temperature, and growth pressure were studied. It was found that the formation of secondary phases in the Mn-doped GaN films is independent of growth pressure but appears to be highly dependent on the $(EtCp)_2Mn$ flux for a given TMGa flux and growth temperature and that a single crystal (Ga,Mn)N film only occurs for $(EtCp)_2Mn$ less than about 0.1 μmole at the temperature of 1040° C. An example of the relationship between the formation of a secondary phases and growth pressure in the Mn-doped GaN films is illustrated in FIG. 9. It was also determined that Ga flux, or Ga growth rate, and the $(EtCp)_2Mn$ to TMGa partial pressure ratio may also affect the occurrence of secondary phases at a given growth temperature. Even for fairly low Mn fluxes (as low as 0.01 μmole) secondary phases readily occur in the (Ga,Mn)N films at lower growth rates, indicating that secondary phase formation may depend on growth kinetics as well as thermodynamic consideration. An example of the relationship between the formation of secondary phases and single crystals based upon manganese and gallium fluxes is illustrated in FIG. 10. At high growth temperatures it is possible for kinetics to dominate where the Mn diffusivity is increased due to an increase in the total number of Ga vacancies, which may enhance the formation of secondary phases. An example of the effect of growth temperature on the formation of secondary phases is illustrated in FIG. 11. Thus, single crystal (Ga,Mn)N films may only be achieved under fairly strict conditions that may depend on growth rate, growth temperature, and the $(EtCp)_2Mn$ flux in the gas phase. Based upon these results and SIMS data, the range of Mn concentrations that can be incorporated into (Ga,Mn)N films without secondary phase formation include Mn concentrations of less than or equal to about $2.5 \times 10^{20}$ atoms per cubic centimeter at a temperature of about 1040° C. and about $1 \times 10^{21}$ atoms per cubic centimeter at a temperature of about 850° C. These concentrations correspond to Mn concentrations in the (Ga,Mn)N films of about 0.6 percent to about 2.3 percent.

VSM measurements were performed at room temperature on the (Ga,Mn)N films in the single crystal region to study the magnetic properties of the films. The VSM measurements of Mn concentrations were compared to the values obtained from SIMS. Differences were found, suggesting that not all of the Mn ions in the (Ga,Mn)N films are contributing to the ferromagnetic coupling of the single crystal (Ga,Mn)N films.

The electrical properties of the (Ga,Mn)N films formed by the MOCVD method of the invention were obtained from room temperature Hall measurements using a Van der Pauw setup. In many instances, the ferromagnetic (Ga,Mn)N films were too resistive to provide accurate measurements of the electrical properties. However, some ferromagnetic samples showed n-type behavior, suggesting that the magnetic properties of the (Ga,Mn)N films of the invention can be improved if the background doping is n-type, as the magnetic moment is increased with decreasing resistivity of the films. The n-type background behavior is unexpected, however, because Mn has been shown to form a deep level acceptor. Therefore, the behavior found in the (Ga,Mn)N films according to the embodiments of the invention appear to be in conflict with current theories stating that ferromagnetism in semiconductors is carrier induced and that p-type behavior is necessary to achieve ferromagnetism at room temperature. The Hall effect measurements also showed that magnetic properties exist in both n-type and insulating films, while showing an improvement in magnetic properties with increasing conductivity.

Furthermore, GaN films typically show n-type conduction when the carrier concentration is in the mid $10^{17}$ atoms per cubic centimeter range for the growth conditions of some embodiments of the invention. This suggests that the room temperature ferromagnetic properties of (Ga,Mn)N films may also be dependent upon carrier concentrations. For instance, the room temperature ferromagnetic properties of (Ga,Mn)N films may be dependent upon the carbon concentration within the (Ga,Mn)N film.

The ferromagnetic properties of transition metal doped III–V material films formed according to embodiments of the invention may depend upon the amount of carbon present in the transition metal doped III–V material films. In transition metal doped III–V material films according to some embodiments of the present invention, the amount of carbon is found in amounts of about $10^{17}$ atoms per cubic centimeter or more. To reduce the loss of carbon from the III–V material film epitaxial layer during the formation of the III–V material film and/or during the formation of a transition metal film and/or the doping of the epitaxial III–V material film, the processes may be performed in the absence of hydrogen gas or in reduced amounts of hydrogen gas. For instance, nitrogen may be used as a carrier gas instead of or in conjunction with hydrogen. Typically, hydrogen has been used as a carrier gas in processes for making transition metal doped III–V material films. Hydrogen gas present during transition metal deposition and annealing processes appears to react with the carbon-hydrogen bonds of the epitaxial III–V material film, causing the release of carbon from the epitaxial III–V material film. By replacing at least a portion of the hydrogen carrier gas with nitrogen carrier gas during formation of the transition metal doped III–V material films, the loss of carbon from the III–V material film is reduced, resulting in a higher carbon concentration in the transition metal doped III–V material films and improved ferromagnetic properties. In other embodiments, hydrogen carrier gas may be eliminated and not replaced with other carrier gases, such as nitrogen.

The loss of carbon from the epitaxial III–V material film may also be caused by high temperature doping of the transition metal to the epitaxial III–V material film. Reducing the temperature of the transition metal doping processes results in a smaller loss of carbon from the epitaxial III–V material film and a greater concentration of carbon in the transition metal doped III–V material films, which in turn provides improved ferromagnetic properties to the transition metal doped III–V material films according to embodiments of the invention.

In other examples of (Ga,Mn)N film growth, GaN films were grown on a substrate using a MOCVD process and doped using a solid-state diffusion process. The deposition of the GaN films began with the deposition of a low temperature GaN buffer layer on a substrate. The GaN buffer layer was formed at about 500° C. and was deposed to a thickness of about 40 nm. The GaN buffer layer was then high temperature annealed to recrystallize the GaN buffer layer. Following recrystallization, a high temperature deposition of a GaN epitaxial layer was performed at about 1000° C. to form an epitaxial GaN layer with a thickness of about 2 $\mu$m over the GaN buffer layer. The substrate with the GaN buffer layer and GaN epitaxial layer was then moved to a vacuum evaporation system for the deposition of a transition metal into the GaN epitaxial layer. A laser ablation deposition technique was used to deposit the transition metal on the GaN epitaxial layer. In this case the transition metal was manganese. A background vacuum was maintained at $10^{-8}$ Torr during the deposition of the transition metal. Following deposition of the transition metal, the GaN epitaxial layer was doped by deposition and annealing at different temperatures ranging from about 250° C. to about 800° C. The annealing process was also carried out in-situ in the laser ablation system (under vacuum) or in the MOCVD system under nitrogen atmosphere.

The film quality of the (Ga,Mn)N layers formed during deposition and after annealing was checked by in-situ reflection high-energy electron diffraction (RHEED). The doped layers were further studied by X-ray diffraction and transmission electron microscopy (TEM). The manganese profile in the doped layers was established by secondary ion mass spectroscopy. The magnetic behavior of the (Ga,Mn)N samples were examined by both vibrating sample magnetometer and magnetoresistance measurements, using the extraordinary Hall effect (EHE). The magnetization of the doped films was measured by VSM both parallel and perpendicular to the plane of the film, whereas the EHE measures only the perpendicular magnetization component of the film. Hall effect measurements using a four-point probe assessed the doping and the carrier concentration in the (Ga,Mn)N layers. The Hall resistance in ferromagnetic materials can be expressed by $R_{Hall} = R_0 B/d + R_S M/d$ where $R_0$ is the ordinary Hall coefficient, $R_S$ is the anomalous Hall coefficient, d is sample thickness, and M is the magnetization of the film. For materials according to embodiments of the invention, the anomalous Hall effect appeared to provide a strong contribution to the Hall resistance and may have aided in the determination of the magnetic properties of the materials. The electrical transport measurements as a function of temperature and field provided detailed information regarding the magnetic ordering in the manganese-doped gallium nitride materials according to embodiments of the invention.

SIMS measurements of the (Ga,Mn)N films formed according to embodiments of the invention verified the diffusion of manganese into the epitaxial GaN layer, forming a concentration gradient from about 9 percent Mn to about 0.1 percent Mn. The SIMS results indicate that the magnetic layer of the (Ga,Mn)N films of the invention may be fairly thin (approximately 15–30 nm) relative to the diamagnetic contribution of the 2 $\mu$m epitaxial GaN layer.

The room temperature magnetic behavior of the Mn-doped GaN films formed according to embodiments of the invention was measured by EHE. The EHE measurements demonstrated magnetic hysteresis and evidence of ferromagnetism in the Mn-doped GaN films. Some embodiments of the invention have an easy axis normal to the film plane. The temperature dependence of the magnetization of the Mn-doped GaN film was tracked by EHE under an applied field $\mu_o H$ of about 0.8 T (at saturation) with temperatures ranging from liquid nitrogen temperature to about 150° C. Depending on the deposition temperature, thickness and/or annealing conditions, the coercive fields of the Mn-doped GaN films of the invention are typically greater than about 50 Oe. The transition temperature marking the loss of ferromagnetic behavior for the Mn-doped GaN films of the invention was found to be above about 300 K, depending upon growth conditions.

(Ga,Mn)N films formed according to some embodiments of the invention exhibit ferromagnetic behavior at temperatures between about 220 K to about 370 K. The extraordinary Hall effect measurements verified the ferromagnetic behavior of these materials at room temperature. Further, the Curie temperature was confirmed by performing a systematic study of the extraordinary Hall effect as a function of temperature and by measuring the temperature dependence for the sheet resistance at zero applied fields. The Curie temperature was found to vary, ranging from 220 K to 370 K, depending on the growth and annealing condition of the GaN as well as the No-doping conditions. X-ray and electron diffraction did not identify the presence of any secondary magnetic phases resulting in the conclusion that the magnetic properties of the (Ga,Mn)N films according to the invention are due to a solid solution, or single crystal, (Ga,Mn)N structure.

Another example of transition metal doped III–V material film according to embodiments of the invention is realized in transition metal doped ternary III–V films of InGaN. According to embodiments of the invention, InGaN films were grown by atmospheric MOCVD on c-plane sapphire substrates in a radio frequency inductively heated vertical chamber. Trimethylgallium (TMGa), ethyldimethylindium (EDMIn), and $NH_3$ were used as precursors for the formation of the InGaN films. A low temperature GaN buffer layer was deposited on a sapphire substrate followed by high temperature annealing for re-crystallization. The re-crystallization of the buffer layer was followed by a high temperature deposition of GaN epitaxial layer at about 1000° C. The temperature was then lowered to a range from about 750° C. to about 830° C. to grow the InGaN. The InGaN film thickness varied from 30 nm to 1 $\mu$m thick. Samples were transferred to a pulsed laser ablation system for Mn deposition, where a 10 to 100 nm Mn film was deposited on the nitride surface; a $10^{-8}$ Torr vacuum was maintained during deposition. Mn doping was achieved by deposition and annealing at different temperatures ranging from about 450° C. to about 800° C. After deposition and annealing, samples were etched in 30% $H_2O_2$ to remove the Mn metal from the surface.

X-ray diffraction θ–2θ and double crystal X-ray (DCXRD) on the (0004) axis and the off axis (11$\bar{2}$4) reflection, were performed on the as grown InGaN. Secondary ion mass spectrometry was used to determine the concentration of Mn in the InGaN layers. Photoluminescence (PL) was used to determine the emission spectra of the films and to correlate this with the percent of InN. A methodology combining the use of PL and XRD was used to determine the strain state of the InGaN films. The magnetic behavior was examined by vibrating sample magnetometery for both the in-plane and out of plane orientations. Hall measurements were performed to characterize the carrier type and concentration before and after Mn doping.

The (In,Mn,Ga)N films formed according to embodiments of the invention exhibited room temperature ferromagnetic properties. The average Mn concentrations in the (In,Mn,Ga)N films formed according to some embodiments of the invention were between about 8 percent to about 9 percent according to the SIMS data. Average Mn concentrations may also be lower. The XRD measurements did not identify any secondary magnetic phases in the (In,Mn,Ga)N films, indicating that the (In,Mn,Ga)N films were single crystal, or solid solution, (In,Mn,Ga)N films. The Hall measurements indicated that the (In,Mn,Ga)N films were either n-type or undetermined, with carrier background concentrations in the mid $10^{17}$ atoms per cubic centimeter range. The carrier background concentrations are similar to those experienced with the (Ga,Mn)N films according to embodiments of the invention. This indicates that room temperature ferromagnetic properties in (In,Mn,Ga)N films may result from the maintenance of carrier, or carbon, concentration of at least $10^{17}$ atoms per cubic centimeter in the (In,Mn,Ga)N films. The ferromagnetic properties of the (In,Mn,Ga)N films also demonstrated a dependence upon the thickness of the (In,Mn,Ga)N films. Compressively strained films exhibited in-plane easy axis whereas fully relaxed films exhibited out-of-plane easy axis. Thus, changing the strain in the film by changing the (In,Mn,Ga)N film thickness rotates the easy axis from in-plane to out-of-plane.

It has also been found that the addition of additional Mn to (In,Mn,Ga)N films causes a shift in the band gap of the material. This shift provides an optical shift to the red spectrum of light in optoelectronic devices. Thus, (In,Mn,Ga)N films with additional Mn deposits may be used with red lasers or other optoelectrical devices employing red spectra.

In some embodiments, the presence of $(EtCp)_2Mn$ in the gas phase will enhance the incorporation of indium into the solid phase during the MOCVD growth of the Mn-doped InGaN film. Thus, the addition of the Mn source, while keeping the same growth conditions such as growth temperature, pressure, partial pressures of TMGa, TMIn, ammonia, and carrier gases the same, enhances the incorporation of indium in the Mn-doped InGaN film. For example, in the absence of an Mn source the incorporation of indium in the InGaN is about 4 percent. Keeping the growth parameters the same, the addition of $(EtCp)_2Mn$ to the gas phase results in an indium incorporation as high as about 15 percent, more than a three-fold increase. Current approaches use reduced growth temperatures to increase the amount of indium in InGaN alloys. However, the reduced growth temperatures require high ammonia flux and extremely low growth rates. Furthermore, the material quality of InGaN grown in such conditions is inferior to those that are grown at higher temperatures. Using embodiments of the present invention, methods for achieving higher indium percentages in ternary InGaN alloys at higher temperatures are possible. Achieving a higher indium percentage using embodiments of the present invention may be important in both optical and electronic devices. For instance, higher indium concentrations are required to achieve green and yellow emission from InGaN based quantum well Light Emitting Diode structures. In microwave devices, higher indium concentrations in the two dimensional electron gas can allow better device performances.

Above room temperature ferromagnetic properties of Fe-doped GaN have also been achieved using embodiments of the invention, wherein (Ga,Fe)N films have been formed. Fe-doped GaN was achieved by solid-state diffusion of Fe into un-doped GaN films. The GaN films were grown by MOCVD on sapphire wafers. The GaN films were moved to an ultra high vacuum (UHV) pulsed laser deposition (PLD) system for deposition of Fe films. Fe doping was achieved by deposition and post-growth annealing at varying temperatures ranging from about 400° C. to about 600° C. The post-growth annealing time was varied between about 45 minutes and about 180 minutes. Residual Fe films on the GaN:Fe surface were removed by etching in a solution of (3:1)$HCl:H_2O$ for up to ten minutes.

The Fe diffusion profile in the GaN layers was established by secondary ion mass spectroscopy. The microstructure of the samples was examined by X-ray diffraction, and transmission electron microscopy. Energy dispersive X-ray (EDX) analysis and Z-contrast imaging combined with electron energy loss spectroscopy was also performed during TEM analysis to examine the presence of Fe particles and SQUID measurements were also used for the magnetic characterization of the (Ga,Fe)N films.

The (Ga,Fe)N films formed according to embodiments of the invention exhibited room temperature ferromagnetic properties. In fact, the (Ga,Fe)N films demonstrated ferromagnetic properties up to 400 K. The diffusion of Fe into the GaN layer was verified by SIMS and the crystalline quality of the Fe-doped GaN films was studied by XRD. No peaks from secondary magnetic phases such as $Fe_xN$ or stable oxides such as $Fe_3O_4$, $Fe_2O_3$, or FeO were found. Furthermore, no presence of secondary phases or precipitates was detected, indicating that the ferromagnetic properties of the (Ga,Fe)N films according to the embodiments of the invention are due, in part, to the solid solution, or single crystal structure, of (Ga,Fe)N films formed according to the invention.

Transition metal doped III–V material films according to various embodiments of the invention may combine the advantages and functionality of magnetic behavior at or near room temperature with a material that also acts as a semiconductor. This can provide the potential for injecting spin polarized carriers in electronic devices for use at or near room temperatures. The transition metal doped III–V material films of embodiments of the invention may be used in various electronic and optoelectronic devices, such as resonant tunneling diodes, light emitting diodes, lasers, fast optical switches, wave guides or other systems where the room temperature ferromagnetic properties of the transition metal doped III–V material films of the invention could be advantageous. Applications utilizing or attempting to utilize information processing and data storage in a single material may also benefit from the transition metal doped III–V material films of the invention because the room temperature ferromagnetic properties of the transition metal doped III–V material films of the invention provide a material that may be used in spintronic applications at or near room temperature. Hence the transition metal doped III–V material films of the present invention may enhance the performance, functionality, and efficiency of electronic devices and optoelectronic devices.

Examples and analysis performed on samples of transition metal doped III–V material films produced according to various embodiments of the present invention follow:

EXAMPLE 1

Figure 12:
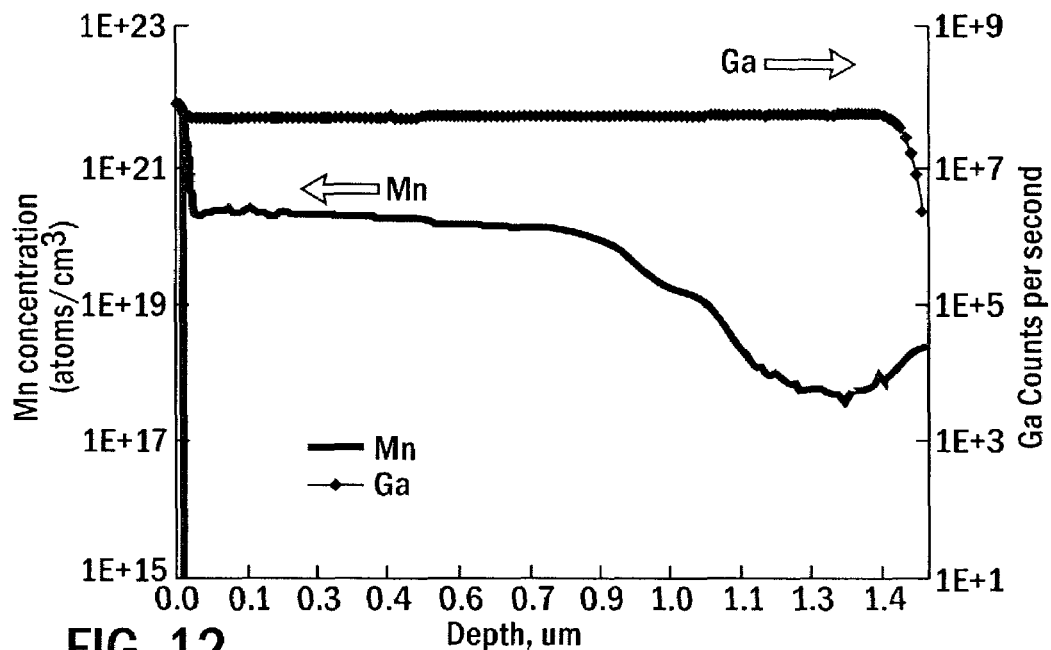
FIG. 12 illustrates a SIMS plot of a Mn-doped GaN film by MOCVD growth.

Concentration profile data, phase data, and ferromagnetic property data were determined for a sample prepared according to MOCVD method embodiments of the present invention. FIG. 12 shows the Mn concentration profile as a function of depth for the sample. The secondary Mn ion count was first calibrated using an ion implanted Mn-doped GaN standard and are reported in atoms/cm$^3$, whereas the Ga compositions are reported in counts per second. The thickness of the (Ga,Mn)N film was about 0.78 μm, and the Mn concentration was approximately 2.5×10$^{20}$ atoms/cm$^3$ of Mn, corresponding to about 0.6 percent in Ga$_x$Mn$_{1-x}$N, for (EtCp)$_2$Mn/TMGa partial pressure ratio of 0.0192 grown at 1040° C.

Figure 13:
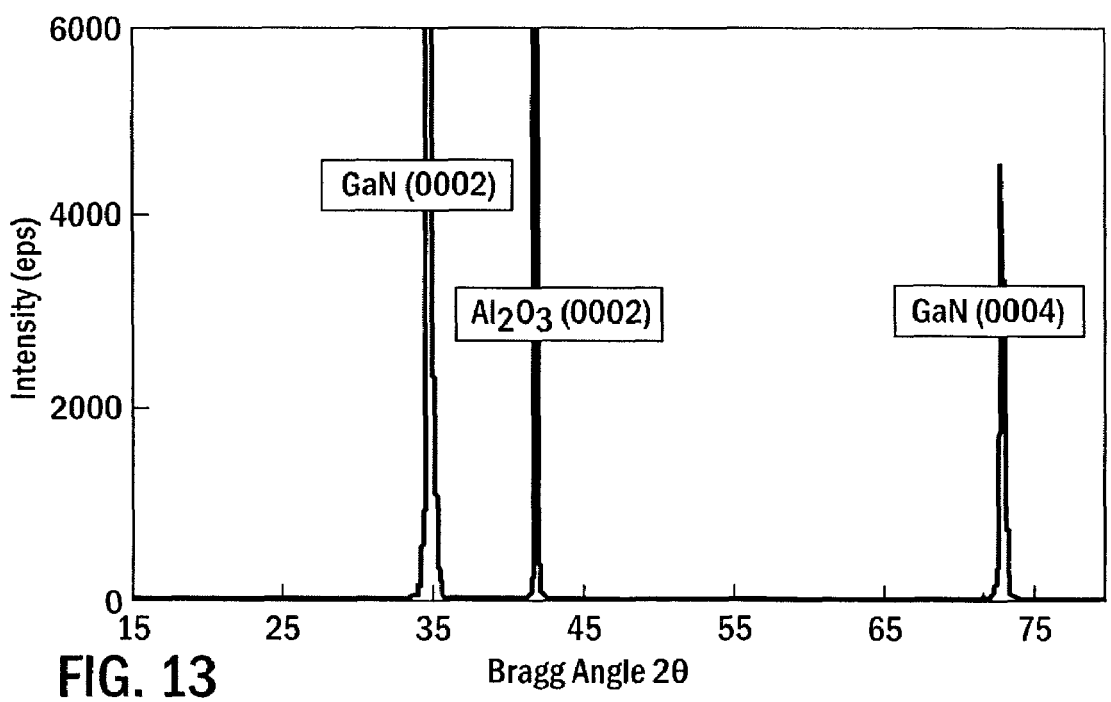
FIG. 13 illustrates an X-ray diffraction pattern of a Mn-doped GaN film.

FIG. 13 shows the XRD pattern for the sample, showing the typical (0002) and (0004) GaN reflections; no secondary phases were observed and no change in lattice parameter was observed with the addition of Mn in the GaN in this sample. This indicates that the magnetic properties of the sample are not a result of secondary magnetic phases, but rather a solid solution of (Ga,Mn)N structure.

Figure 14:
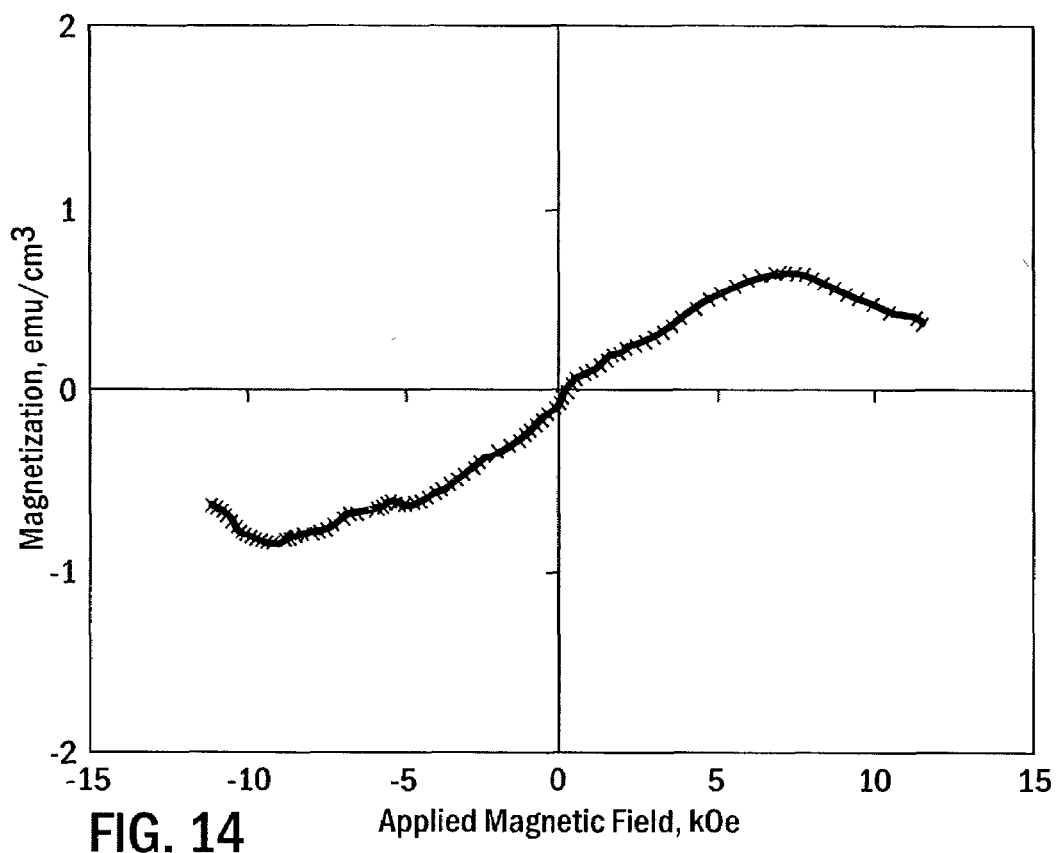
FIG. 14 illustrates the ferromagnetic properties of a Mn-doped GaN film at room temperature.

FIG. 14 shows the ferromagnetic properties for the sample, showing perpendicular magnetization. The saturation moment of the sample was about 1.3 $\mu_B$/Mn atom with a coercivity of about 130 Oe. Assuming that Mn$^{2+}$ atom substitutes for Ga site in the GaN lattice so that J=5/2, the Mn concentration [Mn] calculated from the magnetization curves using M$_S$=[Mn]g$\mu_B$S gives 3.88×10$^{19}$ atoms/cm$^3$, where M$_S$ is the saturation magnetization and the g-factor is 2. This indicates a 15 percent difference in Mn concentration when compared with values obtained from SIMS, suggesting that not all of the Mn ions are contributing to ferromagnetic coupling in the sample.

EXAMPLE 2

Concentration profile data, ferromagnetic property data, and sheet resistance data were determined for (Ga,Mn)N samples prepared according to the solid-state diffusion embodiments of the present invention.

Figure 15:
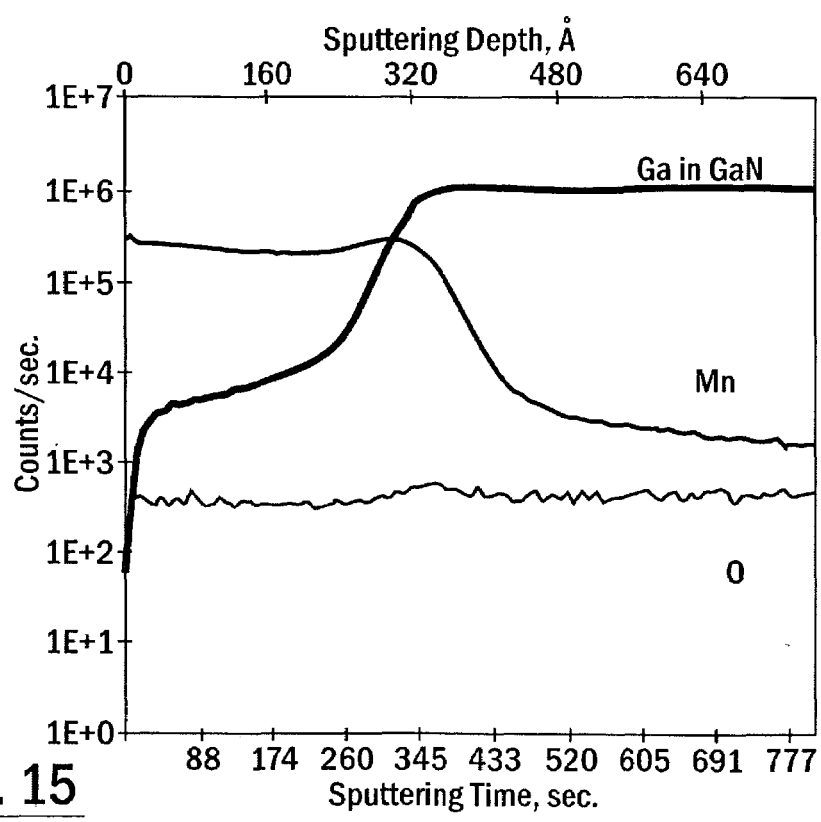
FIG. 15 illustrates a SIMS measurement of a Mn-doped GaN film by solid-state diffusion.
Figure 16:
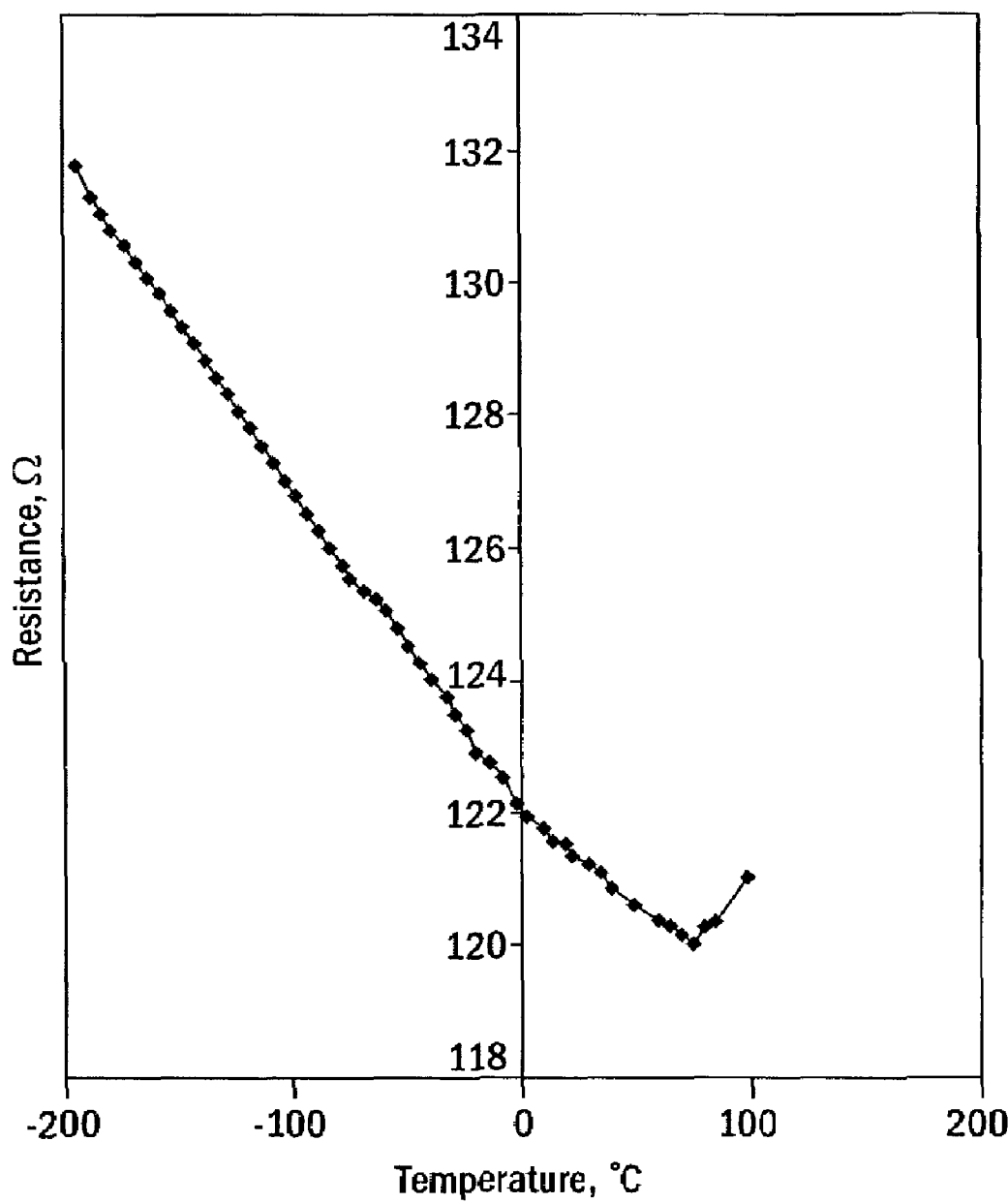
FIG. 16 illustrates the Hall resistance saturation versus temperature of a Mn-doped GaN film.

The SIMS measurement illustrated in FIG. 15 verifies the diffusion of manganese into the hexagonal gallium nitride layer, forming a concentration gradient that levels out at about 1 to 2 percent manganese. Hall resistance measurements, at saturation, versus temperature, are illustrated in FIG. 16. FIG. 16 shows the loss of ferromagnetic behavior varying between about 310 K and 400 K depending on growth conditions.

Figure 17:
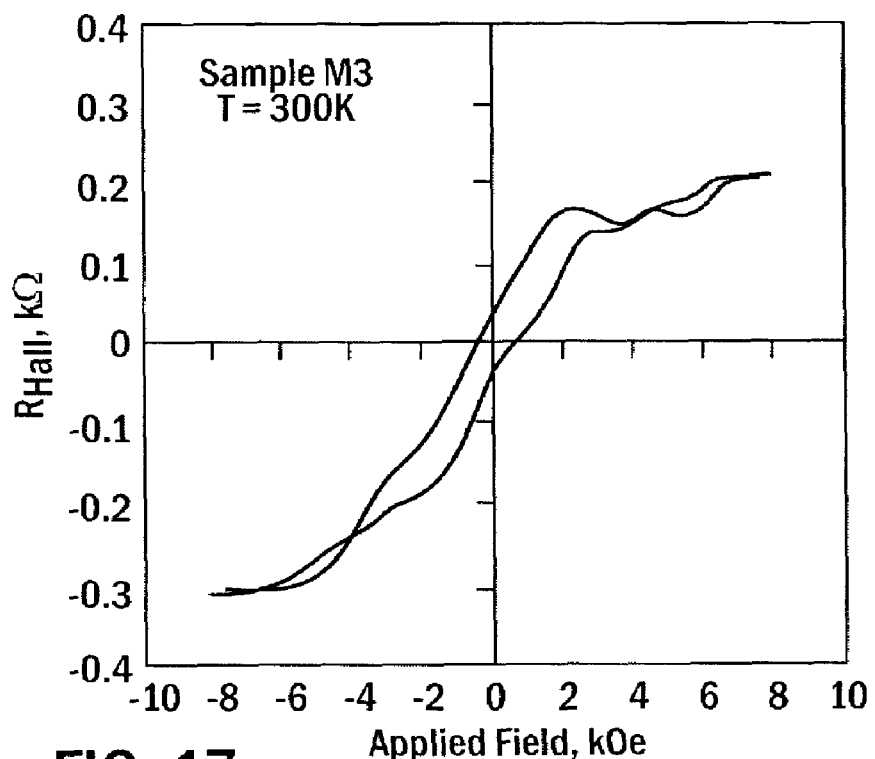
FIG. 17 illustrates a hysteresis curve of a Mn-doped GaN film at room temperature.
Figure 18:
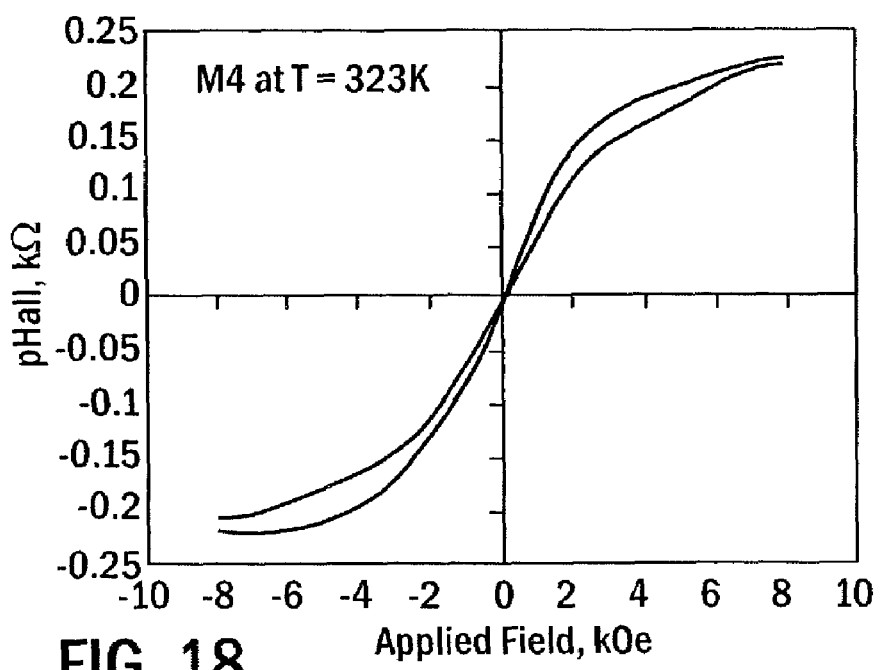
FIG. 18 illustrates a hysteresis curve of a Mn-doped GaN film at room temperature.
Figure 19:
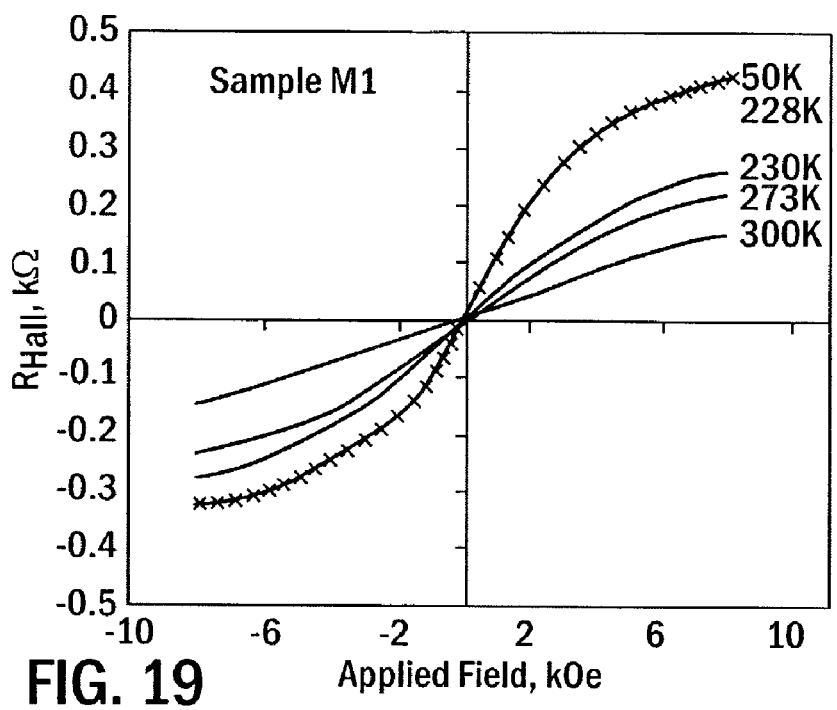
FIG. 19 illustrates the effect of temperature on a hysteresis curve of a Mn-doped GaN film.
Figure 20:
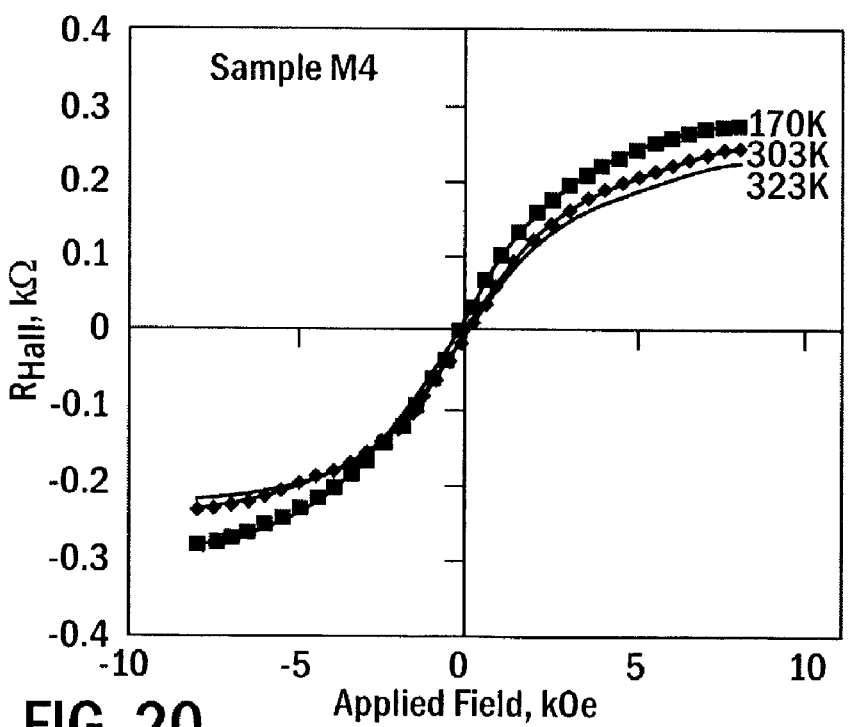
FIG. 20 illustrates the effect of temperature on the hysteresis curve of FIG. 18.

FIGS. 17 and 18 show hysteresis curves for samples M3 and M4 at room temperature and above. FIGS. 19 and 20 demonstrate the effect of temperature on the shape of the hysteresis curves for samples M1 and M4, respectively. The curves show that the magnetization curves of the samples undergo a transition from a linear behavior under an increased applied magnetic field to a typical S shaped curve when the measuring temperatures were lowered.

Figure 21:
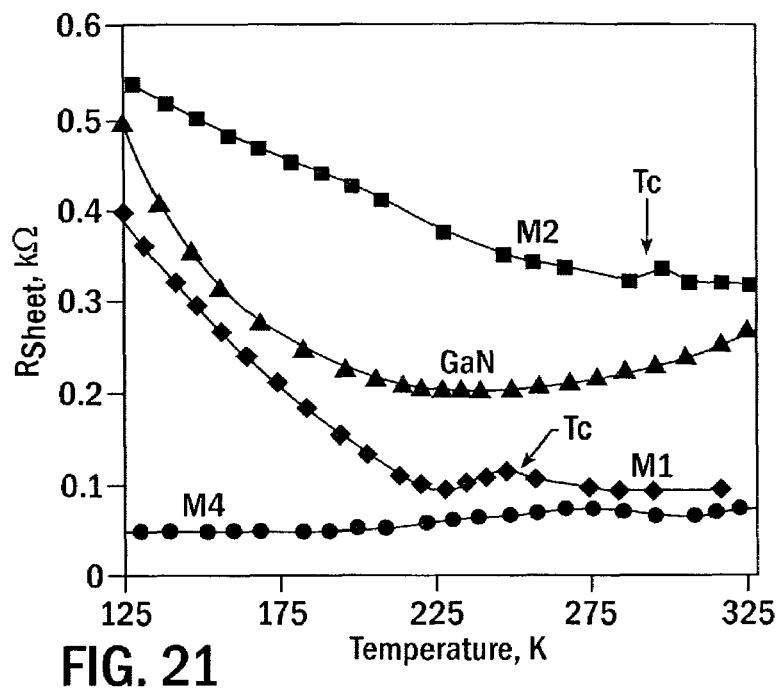
FIG. 21 illustrates the temperature dependence of sheet resistance of samples of Mn-doped GaN films and GaN film.

Sheet resistance as a function of temperature was also determined and plotted in FIG. 21. The sheet resistance (R$_{sheet}$) at zero applied field for (Ga,Mn)N samples M1, M2, M4, and un-doped GaN are illustrated. The resistivity response of samples M1 and M2 shows that they are on the insulator side of the metal-insulator transition, whereas sample M4 is on the metallic side. The humps in the curves for samples M1 and M2 indicate the Curie temperature values. The temperature difference of the sheet resistance measured on the un-doped GaN sample verified the absence of a hump, apparently indicating that it is not an inherent property of a GaN film.

EXAMPLE 3

Concentration profile data determined by SIMS and magnetization data determined by VSM measurements were obtained for various samples of manganese-doped indium gallium nitride prepared by MOCVD according to embodiments of the invention. Four samples of Mn-doped In$_x$Ga$_{1-x}$N, represented by sample numbers RIT01, RIT02, RIT03, and MR125, were analyzed. The x values for the In$_x$Ga$_{1-x}$N in each of the samples are RIT01, x=0.051; RIT02, x=0.063; RIT03, x=0.154 ; and MR125, x=0.154.

Figure 22:
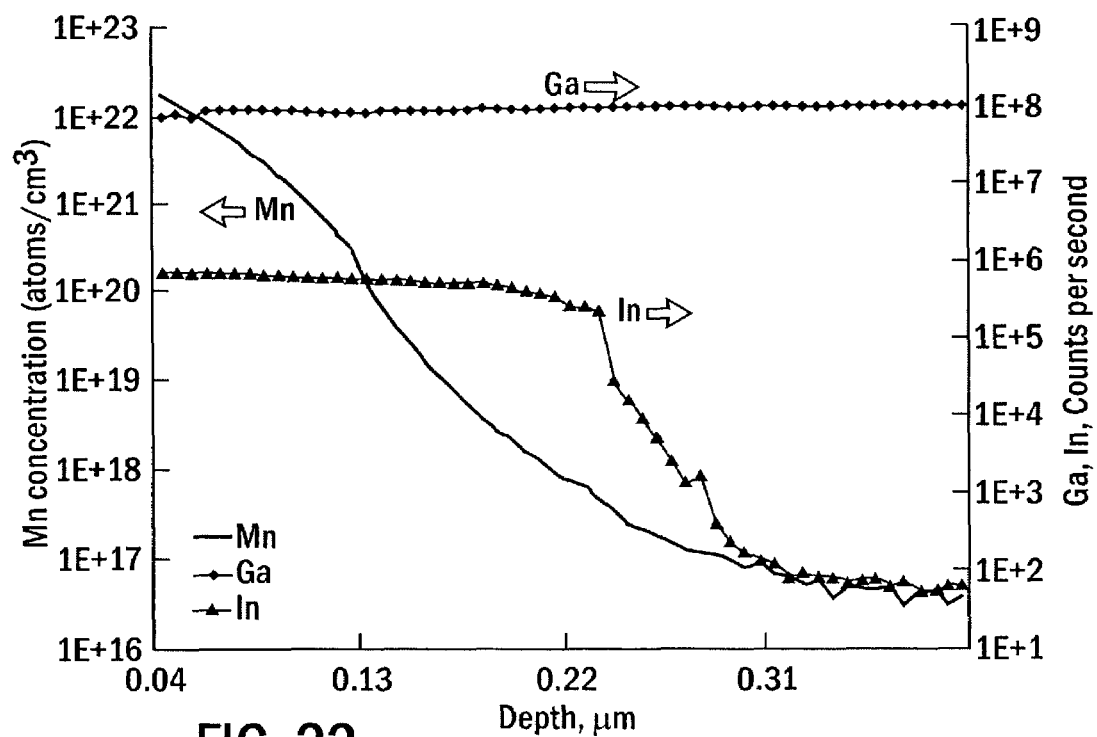
FIG. 22 illustrates a concentration curve of a Mn-doped InGaN film by solid-state diffusion.
Figure 23:
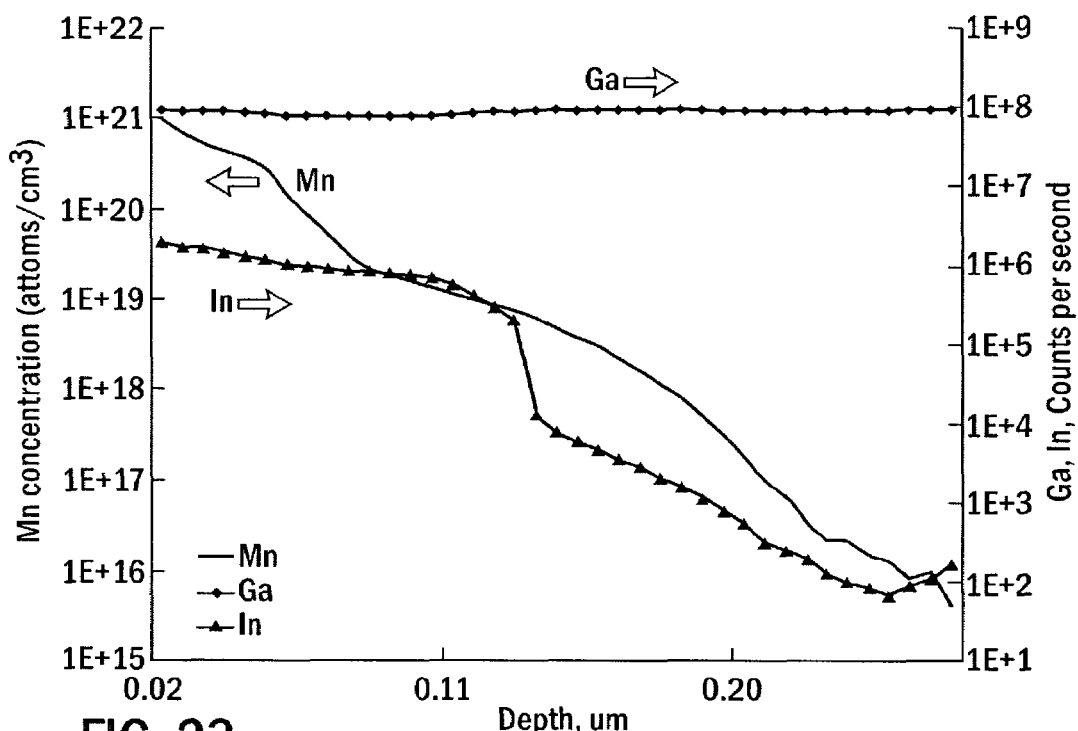
FIG. 23 illustrates a concentration curve of a Mn-doped InGaN film by solid state diffusion.

Concentration profiles of the In$_x$Ga$_{1-x}$N of samples RIT01 and RIT03 were determined and plotted as a function of depth. The manganese compositions were determined by using an ion implanted Mn-doped GaN standard and are reported in atoms per cubic centimeter, whereas the gallium and indium compositions are reported in counts per second. FIG. 22 shows the manganese concentration profile as a function of depth for sample RIT02. The thickness of the In$_x$Ga$_{1-x}$N film was calculated to be about 180 nm, at which point the indium content drops off. This indicates that the average manganese concentration in the film was approximately 3.7×10$^{21}$ atoms per cubic centimeter, or about 8 to about 9 percent in the In$_x$Ga$_{1-x}$N layer. FIG. 23 shows the manganese concentration profile as a function of depth for sample RIT03. The calculated thickness for the In$_x$Ga$_{1-x}$N layer of the sample was about 100 nm. Thus, the average manganese concentration in the RIT03 sample was about 9.64×10$^{20}$ atoms per cubic centimeter, or about 1.8 percent to about 2 percent. The information suggests that manganese may have a higher solubility limit in In$_x$Ga$_{1-x}$N films having small indium concentrations. Hall measurements performed on the samples did not indicate that manganese diffusion in the In$_x$Ga$_{1-x}$N films altered the carrier concentrations of the films, which remained in the mid 10$^{17}$ atoms per cubic centimeter range.

Figure 24:
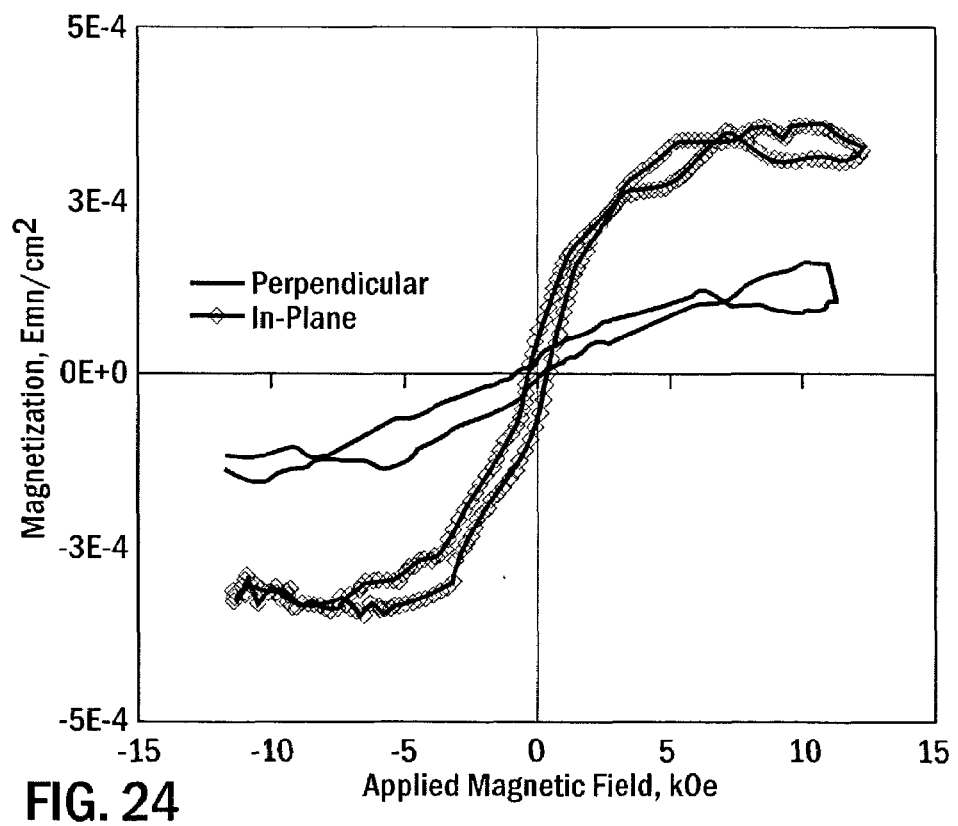
FIG. 24 illustrates magnetization curves of Mn-doped InGaN films at room temperature.
Figure 25:
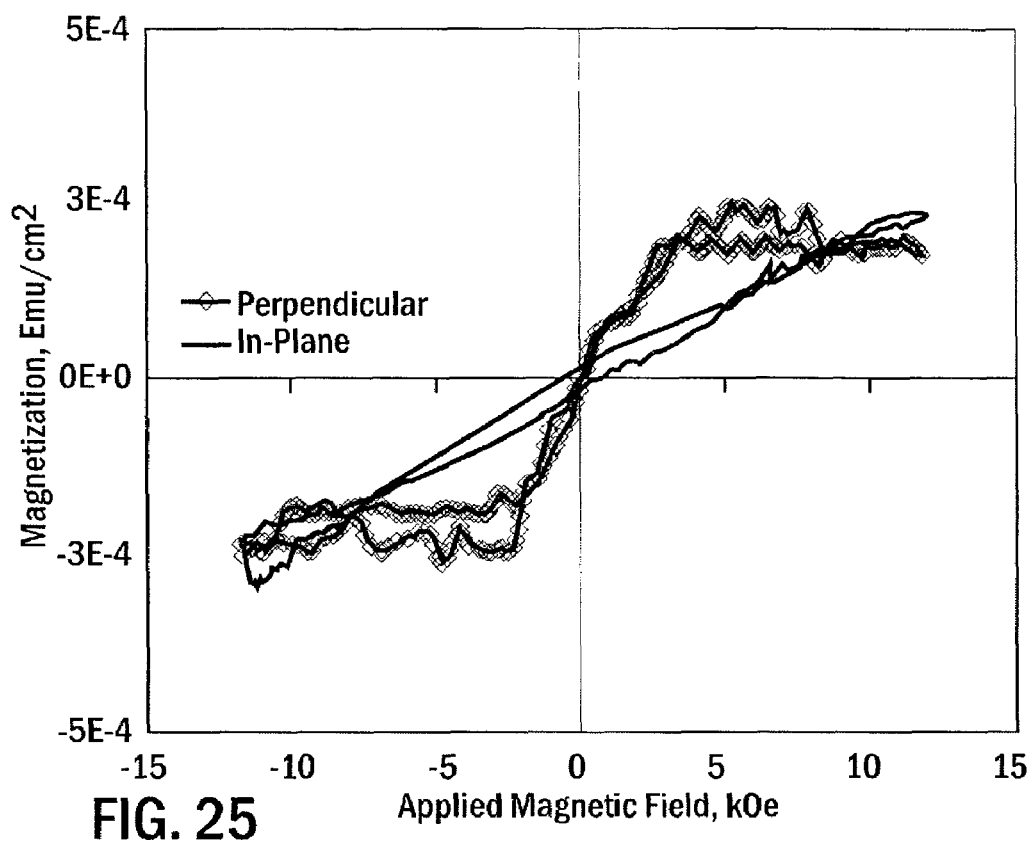
FIG. 25 illustrates a hysteresis curve of Mn-doped InGaN films at room temperature.

VSM measurements were performed at room temperature for samples RIT01, RIT03 and MR125. FIG. 24 illustrates magnetization curves for sample RIT01 having a thickness of about 150 nm. FIG. 24 shows that the RIT01 film has an easy axis when the field is applied parallel to the plane of the sample with a coercive field, H$_C$ of approximately 420 Oe and a saturation field H$_S$ of approximately 3.75 kOe. FIG. 25 illustrates hysteresis curves for the relaxed sample MR125 having a thickness of about 420 nm. The easy axis for sample MR125 is out-of-plane with H$_C$ equal to approximately 60 Oe and H$_S$ equal to approximately 3 kOe. These results indicate an easy axis, in-plane or out-of-plane, depending upon the stress state of the In$_x$Ga$_{1-x}$N film.

Figure 26:
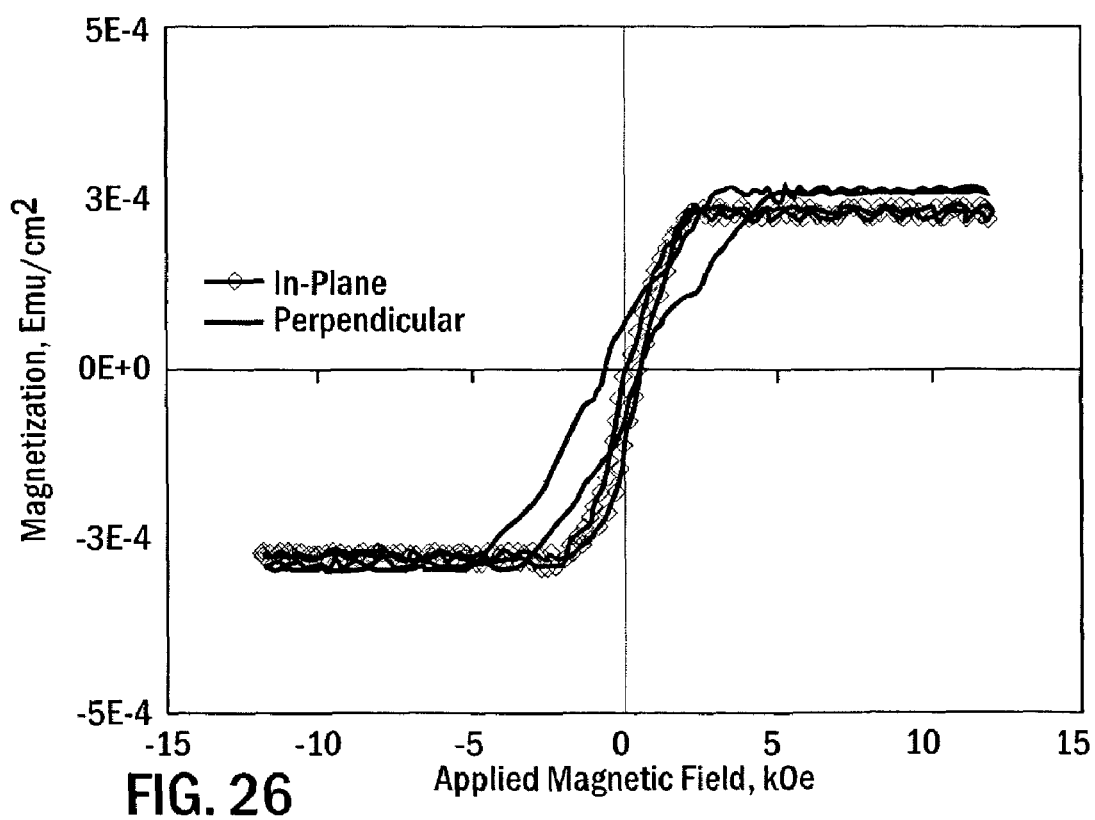
FIG. 26 illustrates magnetization curves of Mn-doped InGaN films at room temperature.

The ferromagnetic properties of the In$_x$Ga$_{1-x}$N samples also indicate the coexistence of strained and relaxed regions. Samples RIT02 and RIT03 were determined to be in a transitional state of stress and both films exhibited ferromagnetic behavior both in and out of plane of the film. FIG. 26 illustrates the magnetization curve for sample RIT03 with a thickness of about 100 nm. Samples RIT02 and RIT03 have a moment of 0.392 $\mu_B$/Mn atom (with a manganese concentration equal to 3.7×10$^{21}$ atoms per cubic centimeter) and 3.43 $\mu_B$/Mn atom (with a manganese concentration equal to 9.64×10$^{20}$ atoms per cubic centimeter), respectively. Thus, the larger moment per manganese atom in the film with the lower manganese concentration is expected, since larger concentrations would decrease the distance between the manganese atoms, forcing direct exchange (antiferromagnetic) coupling.

EXAMPLE 4

Diffusion and magnetization data were determined for samples of (Ga,Fe)N prepared according to embodiments of the present invention.

Figure 27:
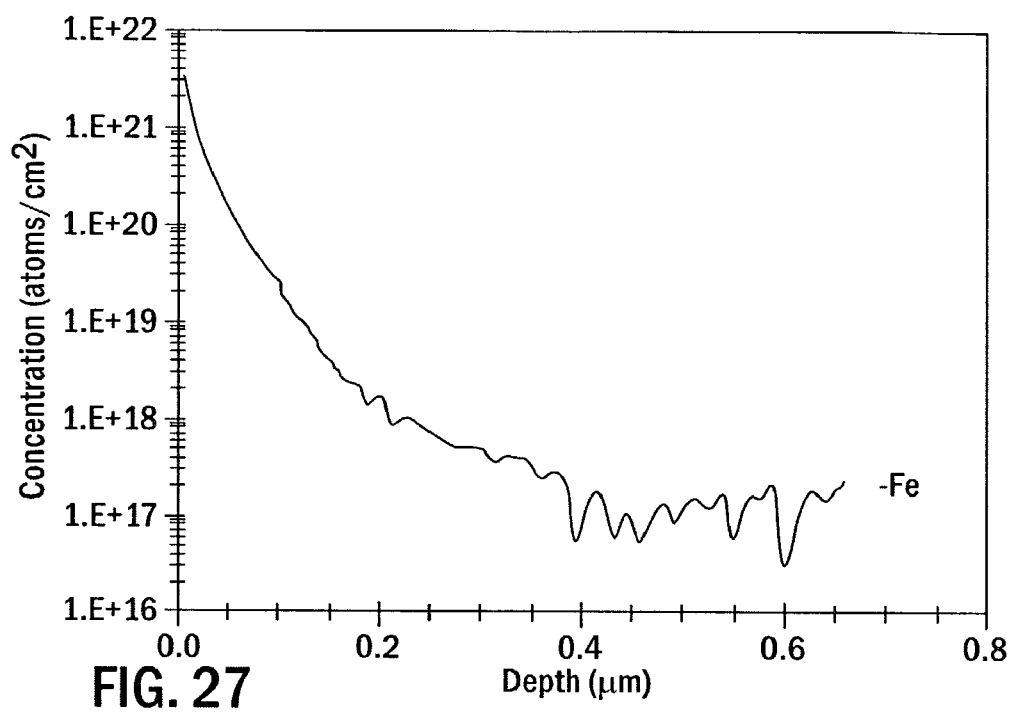
FIG. 27 illustrates a concentration gradient curve of Fe-doped GaN film.

Diffusion of iron into the hexagonal gallium nitride layer was verified by SIMS measurement of sample RIT51. FIG. 27 shows an iron concentration gradient ranging from about $3 \times 10^{21}$ atoms per cubic centimeter at the top of the film to $2 \times 10^{17}$ atoms per cubic centimeter at a depth of about 0.38 µm. From this profile, the concentration of iron, relative to gallium, at the top of the film was determined to be about 7.6 percent. It was also estimated that the active doped layer was very thin, only up to about 0.15 µm thick. A rough estimate of the average iron concentration in the active doped film from these calculations is about $2.3 \times 10^{20}$ atoms per cubic centimeter in the top 0.2 µm of the film. The insert in FIG. 27 shows the raw data from the SIMS analysis with iron and gallium signal intensity in counts per second. From the SIMS data, the diffusion coefficient of iron in gallium was estimated at about $4 \times 10^{-18}$ square centimeters per second, which appears to be in reasonable agreement with the diffusion behavior of iron in other compound semiconductors.

Figure 28:
FIG. 28 illustrates a TEM bright field image of a Fe-doped GaN film.

The secondary phase formation in (Ga,Fe)N films was investigated using TEM on sample RIT43. FIG. 28 illustrates the TEM bright field image of the sample. No evidence of nanoscale iron or $Fe_xN$ precipitates is apparent.

Figure 29:
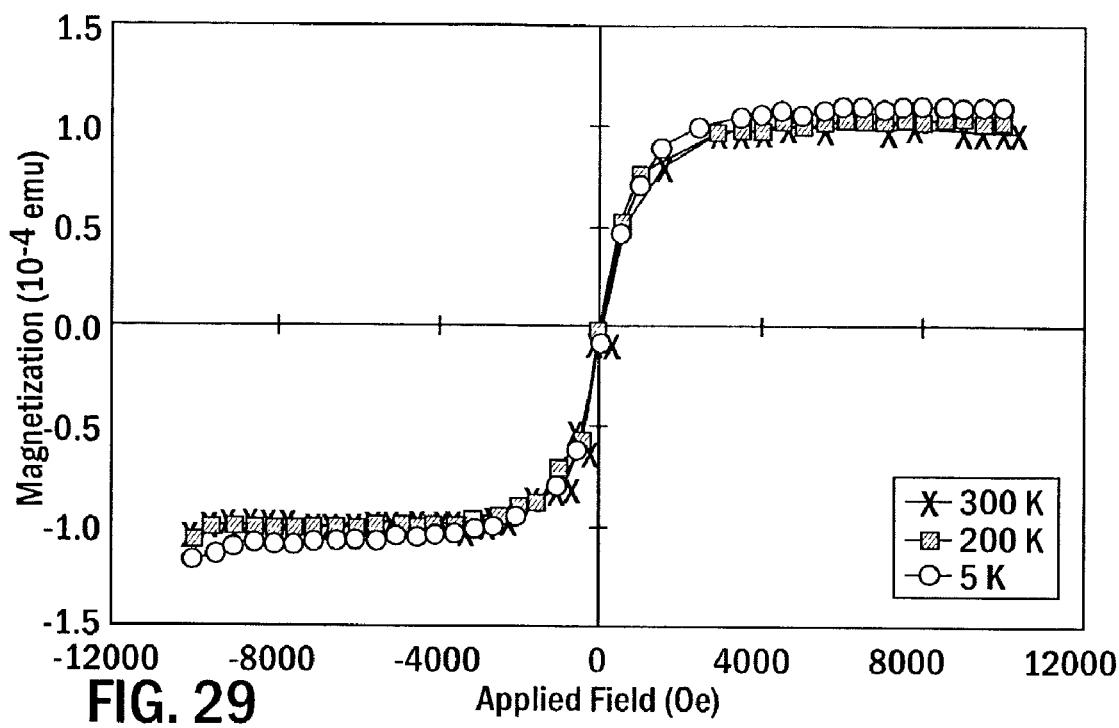
FIG. 29 illustrates magnetization curves of a Fe-doped GaN film by solid-state diffusion.
Figure 30:
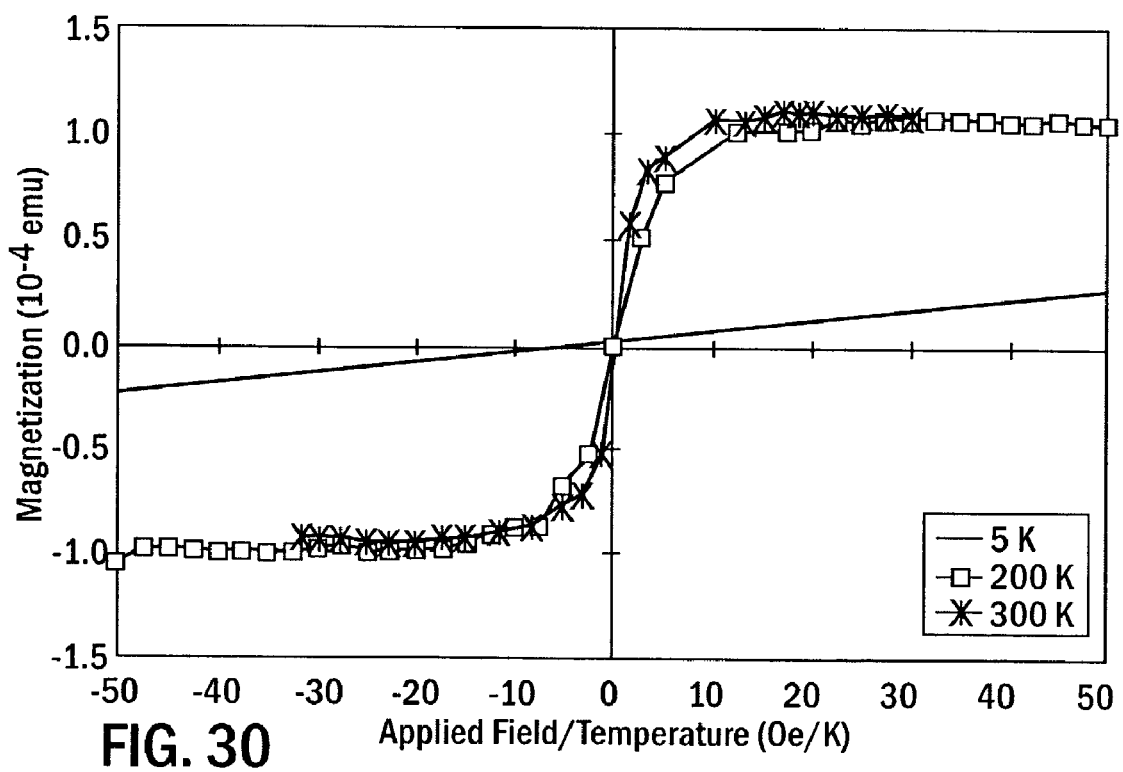
FIG. 30 illustrates magnetization curves of a Fe-doped GaN film.
Figure 31:
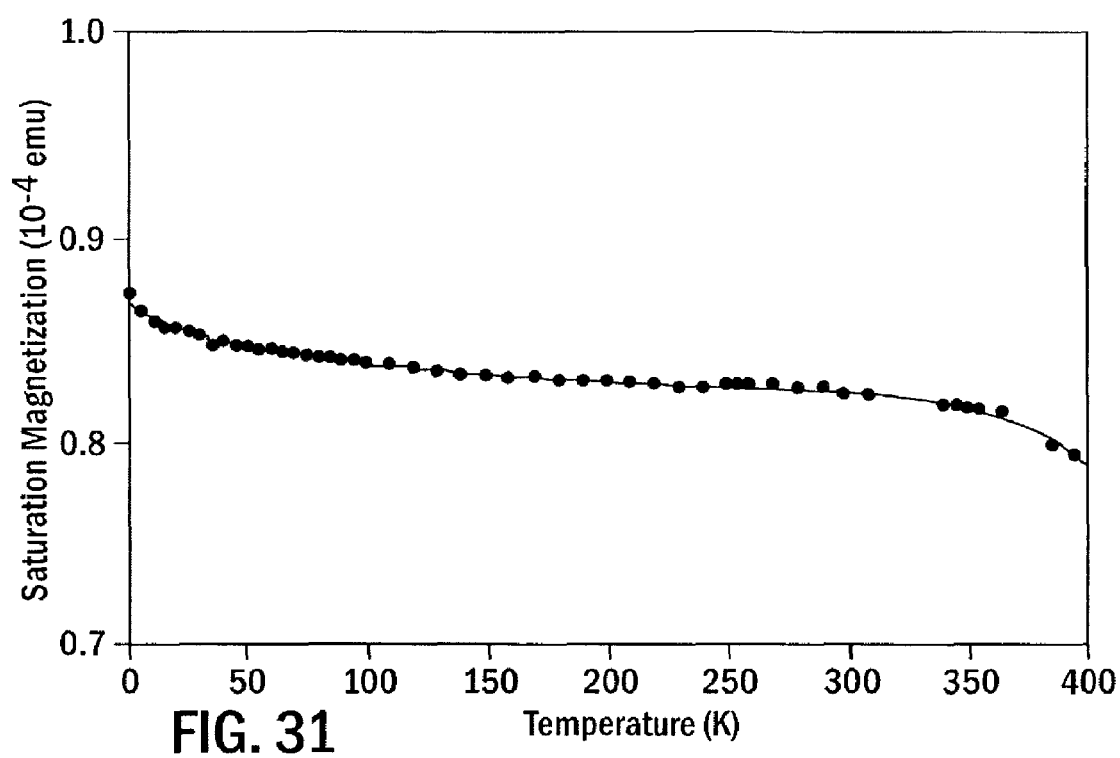
FIG. 31 illustrates effects of temperature on magnetization curves of a Fe-doped GaN film.

The magnetization of sample RIT47 versus an applied field, taken parallel to the sample plane, was measured for temperatures of 5 K, 200 K, and 300 K using a superconducting quantum interference device (SQUID). FIG. 29 illustrates the data for the sample with the diamagnetic background from the 1.3 µm gallium nitride substrate subtracted out. From the data, one observes saturation at all temperatures and a decrease in saturation magnetization from $1.2 \times 10^{-4}$ emu at 5 K to $8.9 \times 10^{-5}$ emu at 300 K. The low-field susceptibility in FIG. 29 does not vary over a wide temperature range, a trend not compatible with superparamagnetism. To amplify this conclusion, M is plotted as a function of H/T in FIG. 30, where the data do not superimpose on a universal curve. FIG. 31 shows $M_S$ for the sample at an in-plane applied field of 3500 Oe for temperatures varying from 5 K to 400 K. From these data it appears that a ferromagnetic contribution is present in the film up to 400 K, indicating that the Curie Temperature of (Ga,Fe)N exceeds 400 K.

Having thus described certain preferred embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A thin film, comprising a transition metal doped III–V material that is ferromagnetic at or above room temperature and a background carrier, the background carrier comprising carbon in a concentration of at least $10^{17}$ atoms per cubic centimeter.

2. The thin film of claim 1, wherein the III–V material is selected from the group consisting of binary III–V materials, ternary III–V materials, quaternary III–V materials, their heterostructures, and mixtures thereof.

3. The thin film of claim 1, wherein the III–V material comprises a III–V nitride material.

4. The thin film of claim 1, wherein the III–V material comprises gallium nitride.

5. The thin film of claim 1, wherein the III–V material comprises indium gallium nitride.

6. The thin film of claim 1, wherein the III–V material comprises $In_xGa_{1-x}N$ wherein $0 \leq x \leq 0.15$.

7. The thin film of claim 1, wherein the III–V material is selected from the group consisting of gallium nitride, aluminum nitride, aluminum gallium nitride, indium nitride, indium gallium nitride, indium aluminum gallium nitride, their heterostructures, and mixtures thereof.

8. The thin film of claim 1, wherein the transition metal comprises iron.

9. The thin film of claim 1, wherein the transition metal comprises manganese.

10. The thin film of claim 1, wherein the transition metal comprises chromium.

11. The thin film of claim 1, wherein the thin film comprises (Ga,Mn)N.

12. The thin film of claim 1, wherein the thin film comprises (In,Ga,Mn)N.

13. The thin film of claim 1, wherein the thin film comprises (Al,In,Ga,Mn)N.

14. The thin film of claim 1, wherein the thin film comprises (Ga,Fe)N.

15. The thin film of claim 1, wherein the transition metal doped III–V material comprises a solid solution structure.

16. The thin film of claim 1, wherein the transition metal doped III–V material comprises a single crystal structure.

17. The thin film of claim 1, wherein the thin film comprises a resistive semiconductor.

18. The thin film of claim 1, wherein the thin film comprises a p-type semiconductor.

19. The thin film of claim 1, wherein the thin film comprises an n-type semiconductor.

20. The thin film of claim 1, wherein the thin film is ferromagnetic at a temperature between about 300 K and about 400 K.

21. The thin film of claim 1, wherein the thin film is ferromagnetic above room temperature.

22. The thin film of claim 1, wherein a density of the transition metal in the transition metal doped III–V material decreases with depth.

23. The thin film of claim 1, wherein a density of the transition metal in the transition metal doped III–V material is substantially constant through the transition metal doped III–V material.

24. The thin film of claim 1, wherein the transition metal doped III–V material comprises at least one transition metal having a concentration between about 0.1 percent and about 9 percent in the transition metal doped III–V material.

25. The thin film of claim 1, wherein the transition metal doped III–V material comprises at least one transition metal having a concentration between about 0.6 percent and about 2.3 percent in the transition metal doped III–V material.

26. The thin film of claim 25, wherein the transition metal doped III–V material is (Ga,Mn)N.

27. A thin film, comprising a transition metal doped III–V material with a carbon concentration of at least $10^{17}$ atoms per cubic centimeter.

28. The thin film of claim 27, wherein the transition metal doped III–V material is ferromagnetic at or above room temperature.

29. The thin film of claim 27, wherein the III–V material is selected from the group consisting of binary III–V materials, ternary III–V materials, quaternary III–V materials, and mixtures thereof.

30. The thin film of claim 27, wherein the III–V material is selected from the group consisting of gallium nitride, aluminum nitride, aluminum gallium nitride, indium nitride, indium gallium nitride, indium aluminum gallium nitride, gallium arsenide, indium gallium arsenide, and mixtures thereof.

31. The thin film of claim 27, wherein the transition metal is selected from the group consisting of iron, chromium, manganese, and mixtures thereof.

32. The thin film of claim 27, wherein the transition metal doped III–V material comprises a single crystal structure.

33. The thin film of claim 27, wherein the transition metal doped III–V material comprises at least one transition metal having a concentration between about 0.1 percent and about 9 percent in the transition metal doped III–V material.

34. The thin film of claim 27, wherein the transition metal doped III–V material comprises at least one transition metal having a concentration between about 0.6 percent and about 2.3 percent in the transition metal doped III–V material.

35. The thin film of claim 34, wherein the transition metal doped III–V material is (Ga,Mn)N.

\* \* \* \* \*